United States Patent
Root

(10) Patent No.: US 8,593,219 B1
(45) Date of Patent: Nov. 26, 2013

(54) METHOD AND APPARATUS FOR AMPLIFYING A RADIO FREQUENCY SIGNAL

(71) Applicant: Motorola Solutions, Inc., Schaumburg, IL (US)

(72) Inventor: Loren F. Root, McHenry, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 13/652,506

(22) Filed: Oct. 16, 2012

Related U.S. Application Data

(60) Provisional application No. 61/695,687, filed on Aug. 31, 2012.

(51) Int. Cl.
*H03F 3/68* (2006.01)

(52) U.S. Cl.
USPC ......... 330/124 R; 330/295; 330/302; 330/305

(58) Field of Classification Search
USPC .............................. 330/124 R, 295, 302, 305
See application file for complete search history.

(56) References Cited

U.S. PATENT DOCUMENTS

| | | | | |
|---|---|---|---|---|
| 3,997,725 | A * | 12/1976 | Gerzon | ........................ 381/21 |
| 4,383,189 | A * | 5/1983 | D'Oro | ........................ 327/361 |
| 5,157,345 | A * | 10/1992 | Kenington et al. | ........... 330/149 |
| 6,262,629 | B1 | 7/2001 | Stengel et al. | |
| 6,922,102 | B2 | 7/2005 | Myer et al. | |
| 7,272,200 | B2 * | 9/2007 | Nishimura et al. | ........... 375/354 |
| 7,288,987 | B2 * | 10/2007 | Carichner et al. | ........... 330/136 |
| 7,336,125 | B2 | 2/2008 | Kyu et al. | |
| 7,619,468 | B1 * | 11/2009 | Bowles et al. | ........... 330/124 R |
| 7,936,213 | B2 | 5/2011 | Shin et al. | |
| 8,013,680 | B2 | 9/2011 | Grondahl et al. | |
| 8,134,510 | B2 * | 3/2012 | Crouch et al. | ................ 343/754 |
| 2011/0279178 | A1 | 11/2011 | Outaleb et al. | |

OTHER PUBLICATIONS

Ghannouchi, F., et al., "Doherty Power Amplifiers in Software Radio Systems," IEEE, 2011, 4 pages.
Jenson, T., et al., "Coupled Transmission Lines as Impedance Transformer," IEEE Transactions on Microwave Theory and Techniques, vol. 55, Issue 12, Dec. 2007, pp. 2957-2965.

* cited by examiner

*Primary Examiner* — Patricia Nguyen
(74) *Attorney, Agent, or Firm* — Steven A. May

(57) ABSTRACT

A radio frequency (RF) amplifier structure provides highly efficient RF signal amplification across a wide bandwidth, when implemented in both inverting and non-inverting Doherty designs, by employing matching impedance transform circuits that comprise a low pass multiple section inductance-capacitance circuit and that provides impedance matching between the output of an amplifier device and a power combiner, wherein the output matching impedance transform circuit has approximately an odd multiple of 90 electrical degrees over the RF amplifier structure's frequency range of operation, and adjustable phase delay circuits that route an amplified RF signal to the power combiner and that are controllably adjusted based on a frequency of an RF input signal over an operating frequency range of the RF amplifier structure.

31 Claims, 10 Drawing Sheets

Inverted Doherty Topology

Inverted Doherty Topology

25Ω to 50Ω Asymmetric Gap Coupled Wide Band Microstrip Transformer

Non-Inverting Doherty Topology

METHOD AND APPARATUS FOR AMPLIFYING A RADIO FREQUENCY SIGNAL

CROSS-REFERENCE TO RELATED APPLICATION

This application claims priority from U.S. provisional application Ser. No. 61/695,687, entitled "METHOD AND APPARATUS FOR AMPLIFYING A RADIO FREQUENCY SIGNAL," filed Aug. 31, 2012, which is application is commonly owned and incorporated herein by reference in its entirety.

FIELD OF THE INVENTION

The present invention relates generally to wireless communication systems, and in particular to the structure of a radio frequency amplifier in a wireless communication system.

BACKGROUND OF THE INVENTION

Radio frequency amplifiers designed for modern wireless communication system formats such as Code Division Multiple Access (CDMA), Universal Mobile Telecommunications System (UMTS), Orthogonal Frequency-division Multiple Access (OFDMA), Long Term Evolution (LTE), and multi-carrier systems that have significant signal peak-to-average requirements, need to balance conflicting performance characteristics such as linearity, efficiency, high signal output power, and wide operational bandwidth. That is, the characteristics of good linearity, high efficiency, and high power operation over a wide bandwidth, while desired, cannot easily be achieved simultaneously in the same amplifier. For example, Class A amplifiers can be very linear and have wideband performance but are inefficient at all output power levels and may be completely impractical at high power levels for reasons of power consumption and heat generation. Class AB amplifiers have decent linearity and high power operation with moderate bandwidths but poor efficiency, whereas amplifiers operating as class C or D have poor linearity but high efficiency. Moreover, most high efficiency techniques such as Class E and F can operate only over limited bandwidths or limited instantaneous bandwidths such as with the current state of the art for various Envelope Modulation amplifiers.

In an attempt to optimally combine linearity and efficiency, a class of high power radio frequency (RF) power amplifiers known as Doherty amplifiers are often employed. Doherty amplifiers combine good linearity and efficiency by operating an amplifier of a primary, or carrier, amplifier stage as, for example, class AB, in parallel with an auxiliary, or peaking, amplifier stage having an amplifier operating as, for example, class C. A signal splitter coupled to an input of each stage splits an input signal to drive the two amplifiers, and a signal combiner coupled to an output of each stage combines the two output signals. When the input signal level is low, the amplifier operates efficiently because the auxiliary amplifier stage is completely cutoff and consumes no power while the primary stage is run into an efficiency enhancing power saturating load. When the input signal level is high, the peaking amplifier turns on through self rectification from the input signal amplitude, the loading on the output of the primary amplifier transitions to that of the system characteristic impedance, and both amplifier stages may deliver up to their maximum power levels and peak efficiencies.

Prior art Doherty amplifiers provide significantly improved efficiency at power levels or in power "back-off" modes that are sufficiently less than the peak output capability of the combined amplifier devices, with sufficient bandwidth to cover most commercial bands of interest—but not typically multiple bands of commercial interest. For example, if fractional bandwidth is defined as $F_{bw}=100\times2(f_2-f_1)/(f_1+f_2)$, then the LTE Band XIII 743-734 MHz has a fractional bandwidth of 2.4%, the U.S. Cell Band at 839-894 MHz has 2.8%, and the 900 MHz GSM at 925-930 MHz has 3.7%. The best prior art might be able to cover both the 839-894 MHz and 925-930 MHz bands with a single amplifier for a fractional bandwidth of about 10% but not all 3 bands above with an effective 25% fractional bandwidth. Included among the many reasons for bandwidth limitation found in most of the prior art are:

(1) A reliance on fixed frequency limiting quarter-wave transmission structures such as transmission line transformers or hybrid coupler transformers for Doherty load modulation, off-state impedance optimization of the peaking amplifier output loading at the Doherty power combine point, power combine phasing, and impedance transformation from the Doherty combine point to the system impedance.

(2) Adherence to the classic Doherty non-inverting topology with its higher than the system impedance saturating load presented to the output of the carrier amplifier match rather than the inverted Doherty topology which presents a lower than system impedance saturating load to the output of the carrier amplifier output match during cutoff of the peaking amplifier and has a broader bandwidth when implemented with a resonant low-Q multiple low-pass matching section solution.

(3) Use of a larger number of hybrid combiner based phase shifting elements in the output the classic Non-inverting Doherty than required, that is, more than two which introduces both additional output power loss and some reduction in the bandwidth.

(4) Failure to use power amplifying devices with minimal output capacitance so that bandwidth limiting impedance expansion over frequency during load modulation of the carrier amplifier can be minimized.

For these reasons, high power Doherty amplifiers of the prior art are tailored mostly to single band operation only and are not suitable for multi-band operation.

Figure 1:
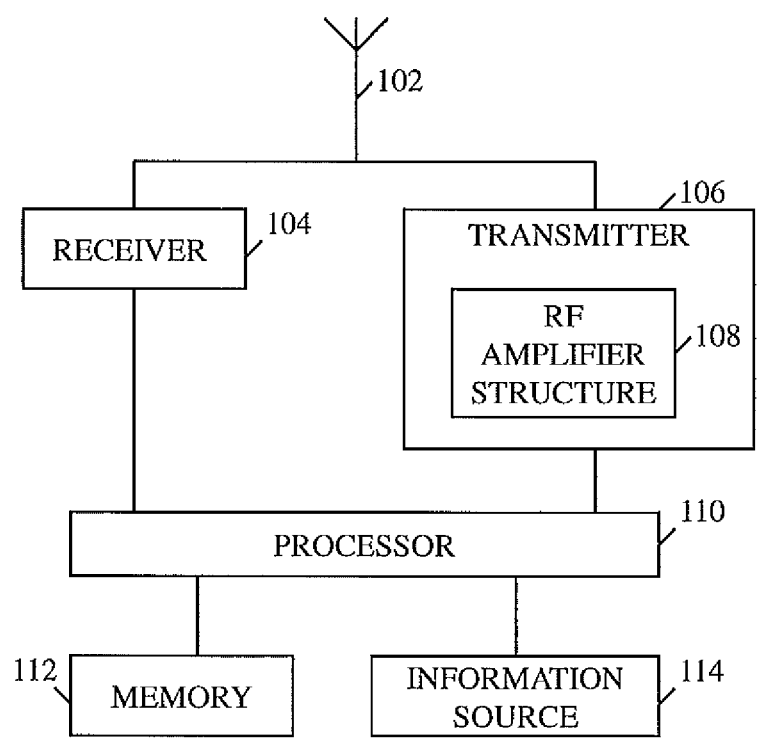
FIG. 1 is a block diagram of a wireless communication device in accordance with an embodiment of the present invention.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. It will further be appreciated that certain actions and/or steps may be described or depicted in a particular order of occurrence while those skilled in the art will understand that such specificity with respect to sequence is not actually required. Those skilled in the art will further recognize that references to specific implementation embodiments such as "circuitry" may equally be accomplished via replacement with software instruction executions either on general purpose computing apparatus (e.g., CPU) or specialized processing apparatus (e.g., DSP). It will also be understood that the terms and expressions used herein have the ordinary technical meaning as is accorded to such terms and expressions by persons skilled in the technical field as set forth above except where different specific meanings have otherwise been set forth herein.

DESCRIPTION OF A PREFERRED EMBODIMENT

To address the need for a high power Doherty amplifier that is suitable for multi-band operation, a radio frequency (RF) amplifier structure is provided that provides highly efficient RF signal amplification across a wide bandwidth, when implemented in both inverting and non-inverting Doherty designs. In a first embodiment of the present invention using an inverting topology realized by employing matching impedance transform circuits that comprise a low pass multiple section inductance-capacitance circuit and that provides impedance matching between the output of an amplifier device and a power combiner, wherein the output matching impedance transform circuit has approximately an odd multiple of 90 electrical degrees over the RF amplifier structure's frequency range of operation, and adjustable phase delay circuits that route an amplified RF signal to the power combiner and that are controllably adjusted based on a frequency of an RF input signal.

Generally, the first embodiment of the present invention encompasses an RF amplifier structure comprising a signal splitter that is configured to receive an RF input signal and produce a plurality of RF signals based on the RF input signal, a first RF amplifier stage having a first RF amplifier device coupled to a first output impedance transforming circuit, wherein the first RF amplifier stage is configured to receive a first RF signal of the plurality of RF signals and produce a first amplified RF signal based on the first RF signal, and a second RF amplifier stage having a second RF amplifier device coupled to a second output impedance transforming network, wherein the second RF amplifier stage is configured to receive a second RF signal of the plurality of RF signals and produce a second amplified RF signal based on the second RF signal.

The RF amplifier structure further comprises a power combiner that is configured to combine the first amplified RF signal and the second amplified RF signal to produce an output signal. Additionally, the RF amplifier structure comprises an output matching impedance transform circuit coupled between an output of the first amplifier device and the power combiner, wherein the output matching impedance transform circuit comprises a low pass multiple section inductance-capacitance circuit and provides impedance matching between the output of the first amplifier device and the power combiner, wherein the output matching impedance transform circuit has approximately an odd multiple of 90 electrical degrees over the RF amplifier structure's frequency range of operation in order to enable impedance inversion between the power combiner and the output of the first amplifier device such that an impedance presented by the output impedance transform circuit to the first amplifier device will be load modulated between a highly efficient power saturating impedance when the second amplifier device is in cutoff and a non-power saturating impedance which delivers high power to the power combiner when the second amplifier is biased on.

The RF amplifier structure also comprises an adjustable phase delay circuit succeeding the second RF amplifier device that receives the second amplified RF signal and routes the second amplified RF signal to the power combiner. In the RF amplifier structure, a phase delay and a reactance of the adjustable phase delay circuit is controllably adjusted based on a frequency of the RF input signal and minimizes a flow of power from the power combiner back into the output of the second amplifier when the second amplifier is in cutoff while allowing power flow from the second amplifier to the power combiner when the second amplifier is biased on.

Additionally, the amplifier structure comprises a wideband impedance transform circuit between the output power combine point and the system level characteristic impedance of transmitter circuitry in communication with the amplifier at the RF amplifier output wherein the wideband impedance transformer provides impedance matching between the power combine point impedance level and the transmitter level impedance over the amplifier frequency range of operation.

Another embodiment of the present invention using a non-inverting circuit topology encompasses an RF amplifier structure comprising a signal splitter that is configured to receive an RF input signal and produce a plurality of RF signals based on the RF input signal, a first RF amplifier stage having a first RF amplifier device coupled to a first output impedance transforming circuit, wherein the first RF amplifier stage is configured to receive a first RF signal of the plurality of RF signals and produce a first amplified RF signal based on the first RF signal, and a second RF amplifier stage having a second RF amplifier device coupled to a second output impedance transforming network, wherein the second RF amplifier stage is configured to receive a second RF signal of the plurality of RF signals and produce a second amplified RF signal based on the second RF signal.

The RF amplifier structure further comprises a power combiner that is configured to combine the first amplified RF signal and the second amplified RF signal to produce an output signal. Additionally, the RF amplifier structure comprises output matching impedance transform circuit coupled to the output of the first amplifier device and an impedance inverter and that provides impedance matching at the output of the first amplifier device. Further, the RF amplifier structure comprises an impedance inverter circuit coupled to an output of the output matching impedance transform circuit and the power combiner and that receives the first amplified RF signal from the output impedance transform circuit and routes the first amplified RF signal to the power combiner, wherein the impedance inverter circuit is controllably adjusted based on a frequency of the RF input signal and is approximately an odd multiple of 90 electrical degrees over an operating frequency range, wherein the impedance inverter circuit provides impedance inversion between the power combiner impedance and the output impedance transform circuit such that the impedance presented by the output impedance transform circuit to the first amplifier device will be load modulated between by a highly efficient power saturating impedance when the second amplifier device is in cutoff and a non-power saturating impedance which delivers high power to the power combiner through the impedance inverter circuit when the second amplifier device is biased on.

The RF amplifier structure also comprises a second adjustable phase delay circuit succeeding the second RF amplifier device and that receives the second amplified RF signal and routes the second amplified RF signal to the power combiner. In the RF amplifier structure, the second adjustable phase delay circuit is controllably adjusted based on a frequency of the RF input signal and wherein the second adjustable phase delay circuit is designed to prevent the flow of power from the power combiner back into the output of the second amplifier while the second amplifier is cutoff but to allow power flow from the second amplifier to the combine point when the second amplifier is biased on.

Additionally, the amplifier structure comprises a wideband impedance transform circuit between the output power combine point and the system level characteristic impedance of transmitter circuitry in communication with the amplifier at the RF amplifier output wherein the wideband impedance transformer provides impedance matching between the power combine point impedance level and the transmitter level impedance over the amplifier frequency range of operation.

Yet another embodiment of the present invention encompasses a method for amplifying a radio frequency (RF) signal. The method comprises receiving an RF input signal, generating a plurality of RF signals based on the RF input signal, and based on a frequency of the RF input signal, adjusting a phase delay and a reactance of one or more controllable, adjustable phase delay circuits to produce one or more phase-delay-and-reactance-adjusted phase delay circuits. The method further comprises amplifying, by a first amplifier stage, a first RF signal of the plurality of RF signals to produce a first amplified RF signal, amplifying, by a second amplifier stage, a second RF signal of the plurality of RF signals to produce a second amplified RF signal, and adjusting, by use of the one or more phase-delay-and-reactance-adjusted phase delay circuits, a phase of one or more of: prior to the amplification by the first amplifier stage, the first RF signal; prior to the amplification by the second amplifier stage, the second RF signal; the first amplified RF signal; and the second amplified RF signal. The method further comprises combining the first amplified RF signal and the second amplified RF signal, wherein the phase of one or more of the first RF signal, the second RF signal, the first amplified RF signal, and the second amplified RF signal has been adjusted by the one or more phase-delay-and-reactance-adjusted phase delay circuits.

The present invention may be more fully described with reference to FIGS. 1-9B. FIG. 1 is a block diagram of a wireless communication device 100 that may implement a radio frequency (RF) amplifier structure in accordance with an embodiment of the present invention. Wireless communication device 100 may be any wireless communication device capable of wirelessly transmitting information, such as a radio access network (RAN) access node such as a base station, a Node B, or an access point, or a user device such as a cellular telephone, a radiotelephone, or a personal digital assistant, laptop computer, tablet computer, or personal computer with wireless communication capabilities.

Communication device 100 includes an antenna 102 coupled to a receiver 104 and to a transmitter 106 having an RF amplifier structure 108. Communication device 100 further includes a processor 110, such as one or more microprocessors, microcontrollers, digital signal processors (DSPs), combinations thereof or such other devices known to those having ordinary skill in the art, that is coupled to each of receiver 104 and transmitter 103. Processor 110 further is coupled to an information source 114 and at least one memory device 112, such as random access memory (RAM), dynamic random access memory (DRAM), and/or read only memory (ROM) or equivalents thereof, that maintains data and programs that may be executed by the processor and that allow the MS to perform all functions necessary to operate in a wireless communication system. Information source 114 may be any source of information that is intended for transmission by communication device 100. For example, in various embodiments of the invention, information source 114 may comprise an interface with devices or networks external to communication device 100, or in the case of a cellular telephone or a radiotelephone, may be a user interface such as a display screen or a microphone. In still another embodiment of the present invention, information source 114 may be included in processor 110 and may be an application running on the processor.

Information source 114 or receiver 104 sources information to processor 110 for subsequent transmission by communication device 100. Processor 110 processes the information in accordance with well-known signal processing techniques and then conveys a signal comprising the processed information to transmitter 106. Transmitter 106 modulates the information onto a radio frequency (RF) carrier to produce an RF signal and routes the RF signal to RF amplifier structure 108, which amplifies the signal for transmission via antenna 102.

Figure 2:
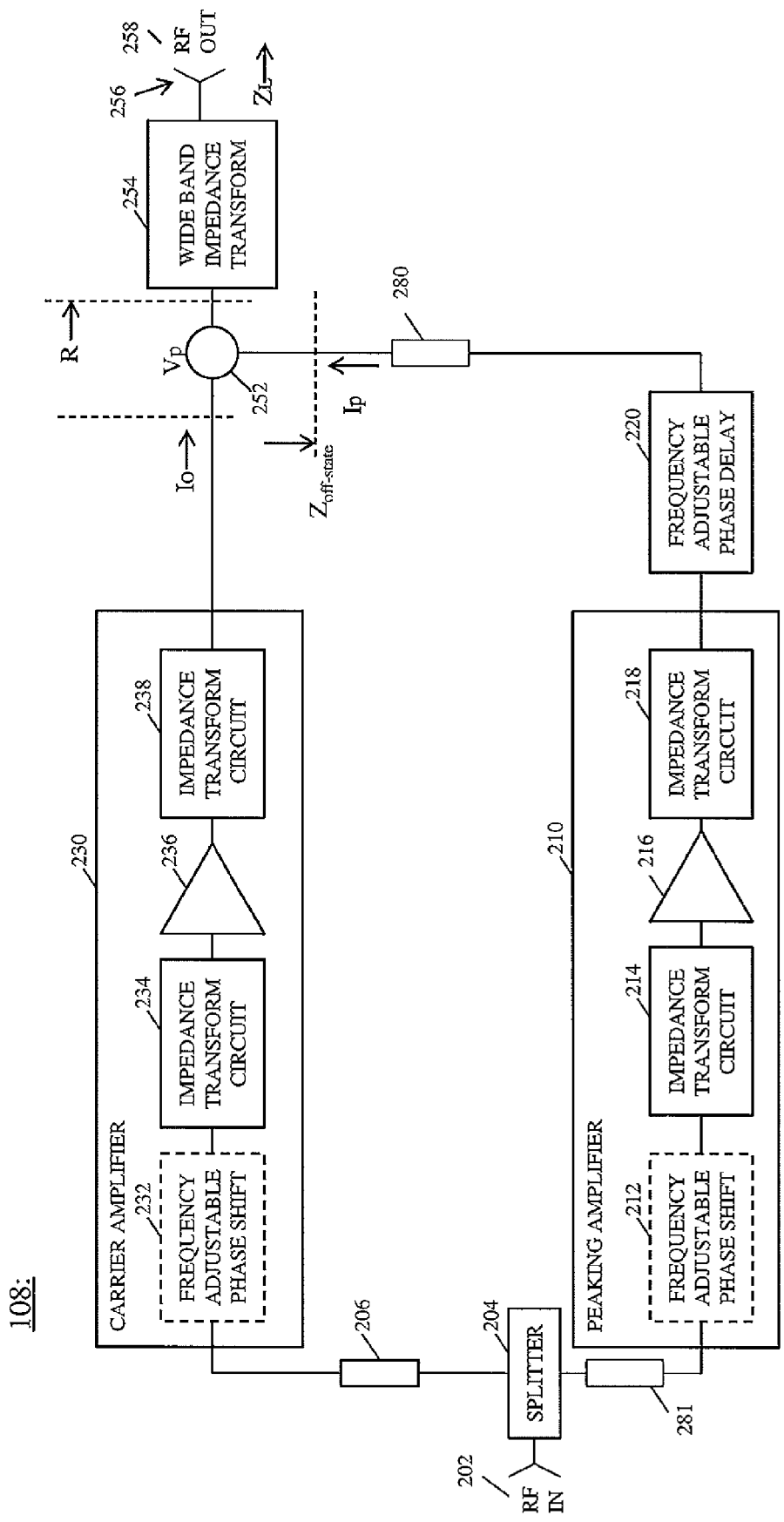
FIG. 2 is a block diagram of a radio frequency (RF) amplifier structure of the communication device of FIG. 1 in accordance with various embodiments of the present invention.

FIG. 2 is a block diagram of RF amplifier structure 108 in accordance with various inverted Doherty topology embodiments of the present invention. In the inverted Doherty topology embodiment, RF amplifier structure 108 comprises two RF amplifier stages 210, 230 configured to operate in parallel, a signal splitter 204 that divides an RF input signal 202 into a first RF input signal and a second RF input signal and respectively routes the first and second RF input signals to an input of each of a first, carrier amplifier stage 230 and a second, peaking amplifier stage 210 of the two RF amplifier stages 210, 230, a frequency adjustable phase delay circuit 220 coupled to an output of peaking amplifier stage 210, and a power combiner 252 coupled, at its inputs, to an output of carrier amplifier stage 230 and to frequency adjustable phase delay circuit 220. RF power amplifier structure 108 further comprises adjustable phase offset transmission lines 206, 280, and 281 that are respectively interposed between signal splitter 204 and the input of carrier amplifier stage 230, the output of peaking amplifier stage 210 and power combiner 252, and signal splitter 204 and the input of peaking amplifier stage 210.

Peaking amplifier stage 210 includes an RF peaking amplifier device 216 that is coupled, at an input, to an impedance transform circuit 214 that is, in turn, coupled to a frequency adjustable phase shift circuit 212. Peaking amplifier device 216 further is coupled, at an output, to an impedance transform circuit 218. Similarly, carrier amplifier stage 230 includes an RF carrier amplifier device 236 that is coupled, at an input, to an impedance transform circuit 234 that is, in turn, coupled to a frequency adjustable phase shift circuit 232. Carrier amplifier device 236 further is coupled, at an output, to an impedance transform circuit 238.

Signal splitter 204 may be comprised of an equal phase equal power splitter such as a Wilkinson splitter with a suitably wide frequency range and impedance matched at its input and output or may have either or both an unequal phase split and unequal power split such as found with a number of hybrid couplers depending upon the desired amplifier performance characteristics. Asymmetric power amplitude coupling sometimes is used as an efficiency enhancement technique for adjusting the turn-on characteristics of the auxiliary, or peaking, amplifier as well as being used to drive asymmetrically sized paralleled amplifying device topologies designed for optimal efficiencies at different relative output power levels. The choice of equal or unequal phase split also sometimes may be determined by a combination of the choice of the type of amplitude splitter being used or simply that the use of a particular splitter saves the most space in combination with the other elements used in the design.

Figure 6:
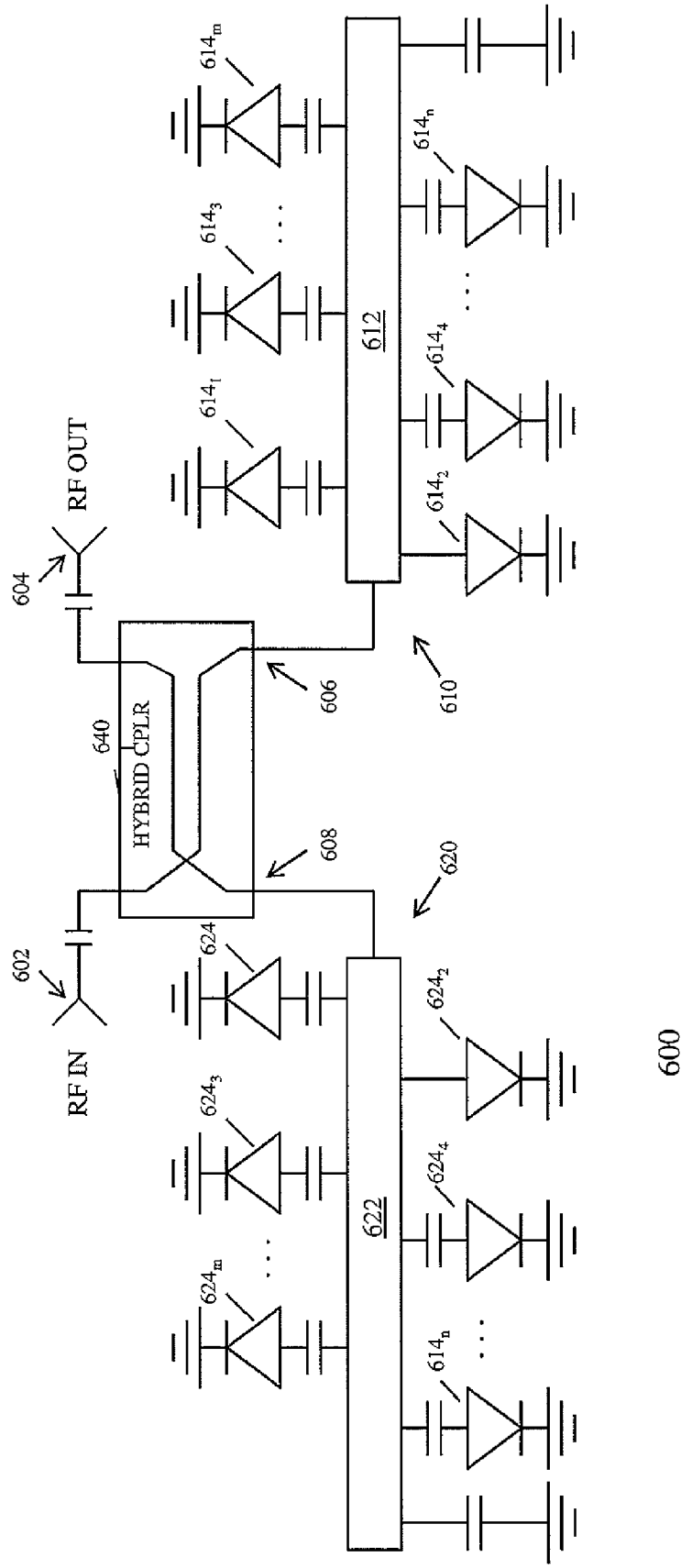
FIG. 6 is a block diagram of a frequency-adjustable phase delay circuit of an RF amplifier structure in accordance with an embodiment of the present invention.
Figure 7:
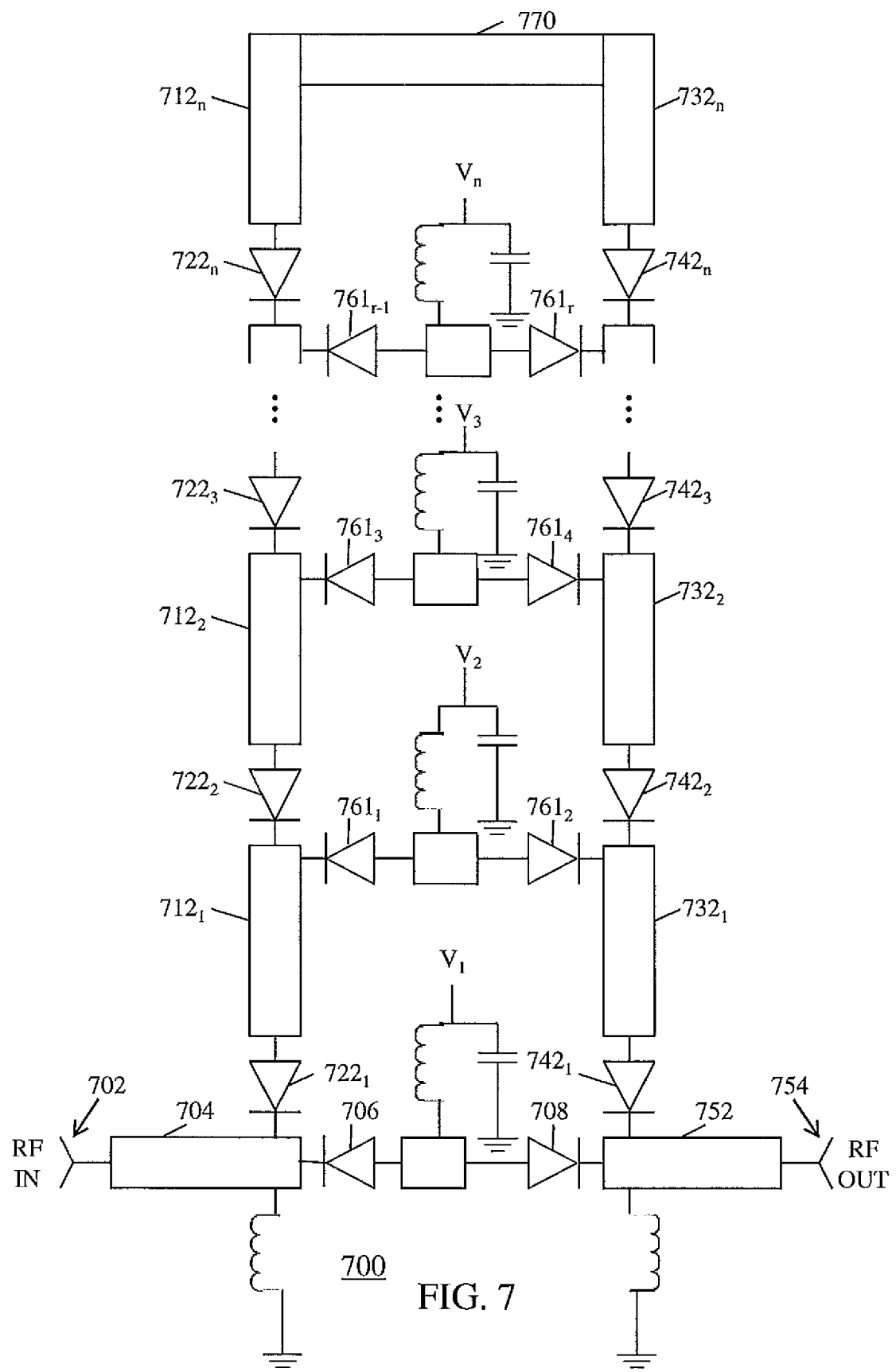
FIG. 7 is a block diagram of a frequency-adjustable phase delay circuit of an RF amplifier structure in accordance with another embodiment of the present invention.
Figure 8:
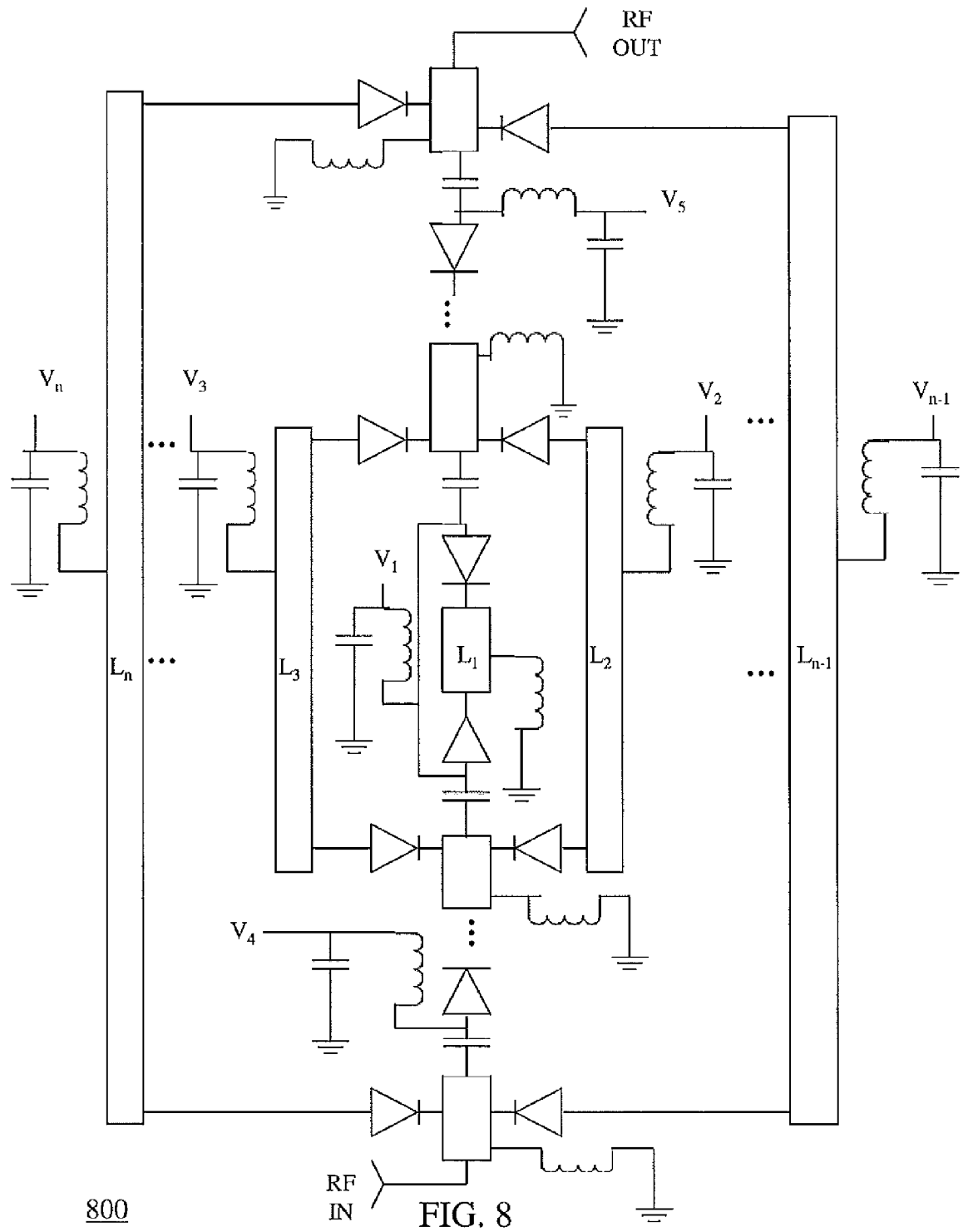
FIG. 8 is a block diagram of a frequency-adjustable phase delay circuit of an RF amplifier structure in accordance with another embodiment of the present invention.

RF amplifier structure 108, as depicted in FIG. 2, may include none, one, or both frequency adjustable phase shift circuits 212, 232, respectively placed at the input of peaking amplifier stage 210 and carrier amplifier stage 230, which frequency adjustable phase shift circuits adjust the phase through either or both of the peaking and carrier amplifier stage pathways to power combiner 252 so that an equal phase delay for maximum power combining at power combiner 252 exists through each of the peaking and carrier amplifier paths, that is, through input splitter 204 to power combiner 252 (also referred to herein as power combine point 252). In various embodiments of the present invention, frequency adjustable phase shifter circuits 212 and 232 may be implemented using a hybrid coupler phase shifter using affixed transmission lines and PIN diode tuning as depicted in FIG. 6 or using PIN diodes and varying lengths of transmission line as depicted in FIGS. 7 and 8.

Phase-matching transmission lines 206, 280, and 281 are used to offset a phase shift in a design-centering fixed frequency manner if needed during a manufacturing alignment process and can be, for example, simple parallel microstrip transmission line traces bridged by a moveable surface mount chip capacitor. The frequency adjustable delay of frequency adjustable phase delay circuit 220 is used to adjust an off-state impedance, $Z_{off\text{-}state}$, of peaking amplifier device 216 of peaking amplifier stage 210 as seen from power combine point 252 looking back into the RF peaking amplifier stage 210 output for optimal performance over frequency while the peaking amplifier stage, that is, peaking amplifier 216, is in cutoff mode. This optimal off-state impedance preferably is sufficient in magnitude so as to prevent a leakage of power at power combine point 252 back into the output of peaking amplifier stage 210, and more particularly into peaking amplifier device 216, rather than continuing on to an output wide band impedance transformer 254 that is coupled to power combiner 252. Impedance transform circuit 218 forms an output impedance matching circuit for peaking amplifier device 216.

Impedance transform circuit 238 of carrier amplifier stage 210 performs impedance matching between carrier amplifier device 216 and power combine point 252. In response to changes in loading conditions at power combine point 252 resulting from changing contributions of signal power being supplied to the power combine point primarily by peaking amplifier device 216 operating in a largely self rectified mode in response to a magnitude of the signal level of RF input signal 202, impedance transform circuit 238 modulates the impedance loading seen by the output of carrier amplifier device 236 across and between two extreme loading conditions corresponding to high power operation, where both the carrier amplifier device and the peaking amplifier device are at full power output power, and low power operation, where the peaking amplifier device is cutoff and only the carrier amplifier device is on.

In a first condition of operation, wherein both carrier amplifier device 236 and peaking amplifier device 216 are fully biased on and contributing full power to power combine point 252 in a parallel connection, impedance transform circuit 238 must present a load to the output of carrier amplifier device 236 that enables the device to operate at its full output power capability. Usually, this just means that both the impedance transform circuits 218, 238 of peaking amplifier stage 210 and carrier amplifier stage 230 are matched for high power operation into a load equivalent to a system impedance, $Z_L$, such that their parallel combination at power combine point 252 is equivalent to half of the system impedance, $Z_L/2$. If an input impedance of wide band impedance transformer 254, R, connected to the power combine point 252, is arranged to be half of the system impedance, $Z_L/2$, then the power combine point 252 impedance will be matched to the system impedance, $Z_L$, through the wide band power transform 254 for maximal power transfer at an output 258 of RF amplifier structure 108.

In a second condition of operation, at low power operation of RF amplifier structure 108, peaking amplifier device 216 is in cutoff and is presenting a high off-state impedance, $Z_{off\text{-}state}$, at power combine point 252 such that peaking amplifier stage 210 appears removed from the power combine point so that impedance transform circuit 238 is essentially terminated at the power combine point with the input impedance of the wide band transformer 254, R, equal to $Z_L/2$. While terminated in the input impedance of the wide band transformer 254, $Z_L/2$, impedance transform circuit 238 must present a highly efficient saturating load to the output of carrier amplifier device 236.

Impedance transform circuit 238 makes use of the properties of impedance inversion as well as the load modulation between $Z_L/2$ and $Z_L$ at its output terminal connected to power combine point 252 in order to provide this highly efficient saturating load to the output of carrier amplifier device 236 during cutoff of the peaking amplifier stage when impedance transform circuit 238 is essentially terminated in $Z_L/2$ and high power operation when impedance transform circuit 238 is terminated in the equivalent of the system load, $Z_L$. By impedance inversion, it is meant that $Z_L$ and $Z_L/2$ have substantially the impedance relationship $Z_L/2 = (Z_o)^2/Z_L$ over a significant frequency range, where $Z_o$ is the characteristic impedance equivalent to the geometric mean between the system impedance $Z_L$ and half its value, $Z_L/2$, that is, $Z_o = (Z_L * Z_L/2)^{1/2}$.

Figure 3:
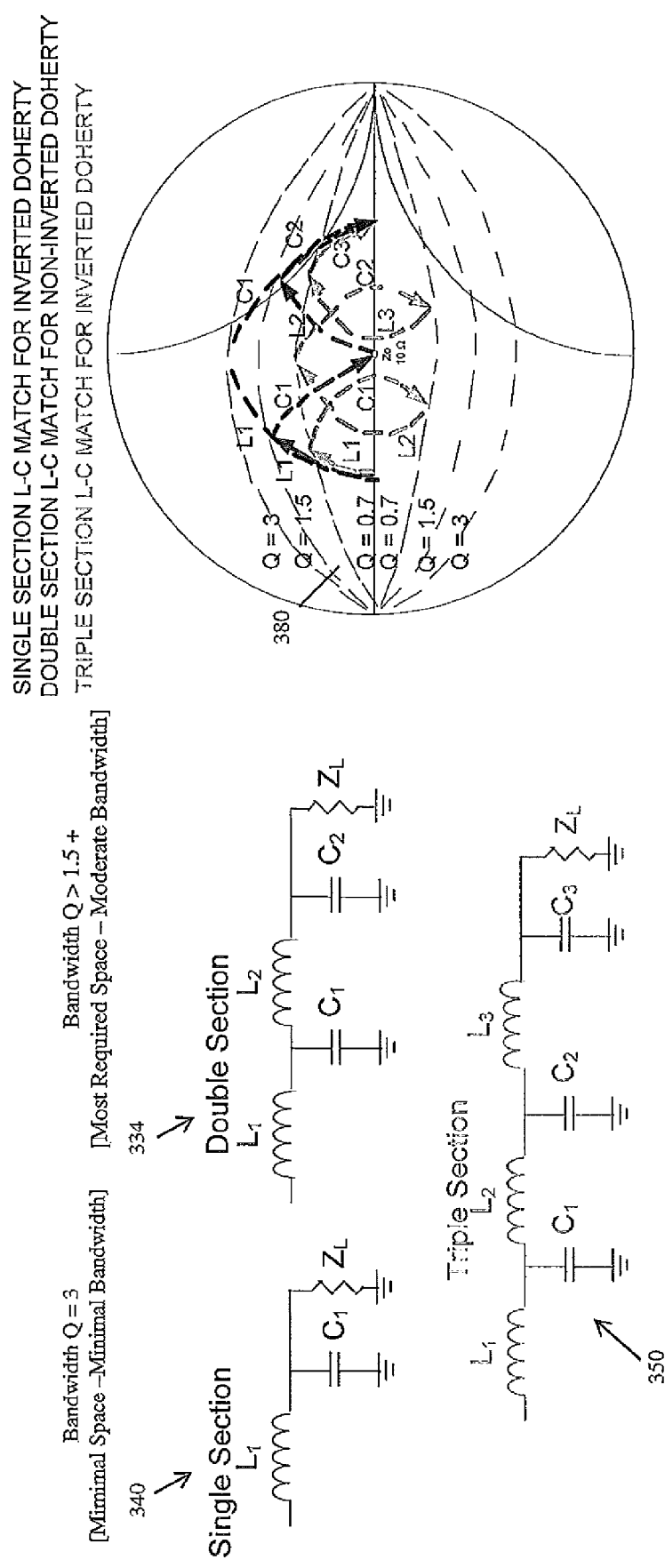
FIG. 3 is an schematic diagram of exemplary inductor-capacitor low Q impedance match circuits for use in an RF amplifier structure in accordance with various embodiments of the present invention.

In the operation of RF amplifier structure 108, however, a quarter-wave transmission line of the characteristic impedance, $Z_o$, appended to an impedance match for loading of carrier amplifier device 236 that would degrade the operational bandwidth at frequencies substantially different from a quarter-wave, is not used. Rather, and referring now to FIGS. 2 and 3, in order to provide a substantially improved bandwidth performance, output matching impedance transform circuit 238 employs multiple low pass inductor-capacitor matching sections 350 (for illustrative purposes, FIG. 3 depicts a single low pass inductor-capacitor matching section 340, a double low pass inductor-capacitor matching section 334, and a triple low pass inductor-capacitor matching section 350) to provide a low Q low pass broadband multiple section inductance-capacitance circuit solution with both impedance match and inversion properties. In order to create the required impedance inversion property, the low Q impedance transform of inductor-capacitor matching section 350 is designed to have a phase shift through its network that is approximately an odd multiple of 90 electrical degrees over a wide frequency range (one of ordinary skill in the art realizes that it is not possible to precisely maintain an odd multiple of 90 electrical degrees over a wide frequency range), such that when impedance transform circuit 238's output terminating load at the power combine point 252 is modulated between $Z_L$ and $Z_L/2$, impedance transform circuit 238 of the carrier amplifier stage 230 produces an impedance at the output of the carrier amplifier device 236 suitable for high power operation when terminated in $Z_L$ and a highly efficient power saturating impedance when terminated in $Z_L/2$. This modulation and impedance transformation process is similar to what would be produced by a combination of a quarter-wave transmission line with a characteristic impedance the same as the system impedance and a high power impedance transform circuit designed to operate into the system impedance but with better bandwidth, since the use of multiple low pass inductance-capacitance matching sections can produce a lower matching 'Q' with a broader bandwidth than a match appended to a quarter-wave line since the use of a quarter-wave line becomes the bandwidth limit as the inversion process falls apart at frequencies substantially different than a quarter-wave.

Figure 4:
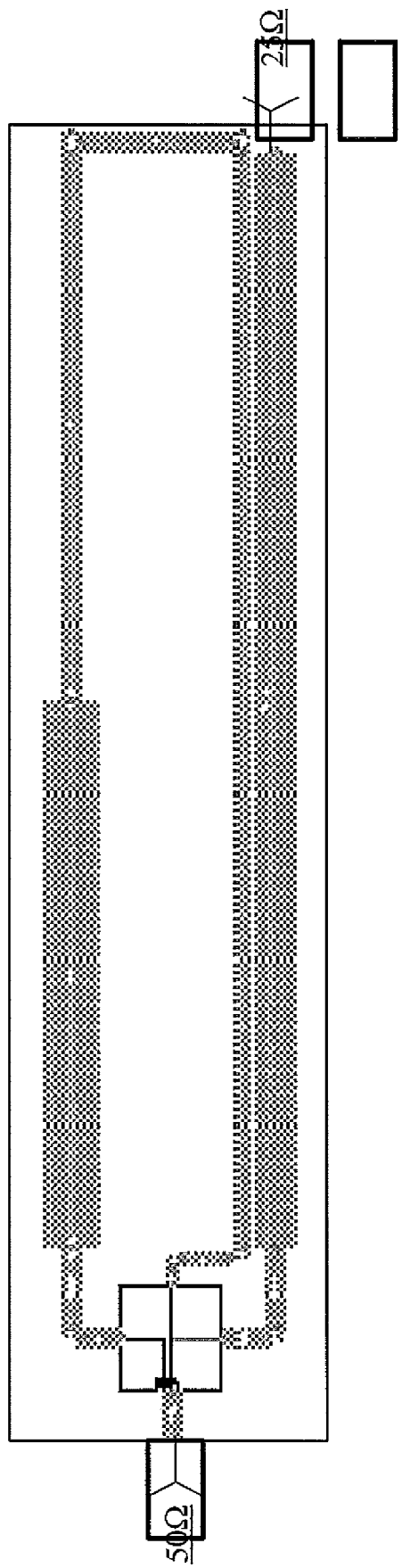
FIG. 4 is a schematic diagram of a wide band microstrip impedance transformer for use in an RF amplifier structure in accordance with an embodiment of the present invention.

As a design example and referring now to FIGS. 2 and 4, assume a 50Ω system using equally power-sized peaking and carrier amplifier devices, where the power combining point 252 impedance, R, is chosen to be half that of the system impedance, that is, R=25Ω, and wide band impedance transform 254, such as a microstrip asymmetrical gap coupled transformer as depicted in FIG. 4, would provide a 25Ω-to-50Ω impedance transition between power combine point 252 and the system level impedance at output 258. In such a circumstance, impedance transform circuit 218 of peaking amplifier stage 210 and impedance transform circuit 238 of carrier amplifier stage 230 are designed to deliver full power capability into 50Ω loads so that their parallel combination is effectively 25Ω and is impedance-matched to the input of wide band impedance transform 254 in a 25Ω terminal impedance at power combine point 252. In this full power parallel operation scenario, impedance transform circuit 238 of carrier amplifier stage 230 is terminated at an effective 50Ω at power combine point 252 and is designed to provide a high power impedance match to the output of carrier amplifier device 236. During cutoff of peaking amplifier device 216 as previously noted, impedance transform circuit 238 would be terminated in 25Ω, and the impedance inversion property of the low 'Q' multi-section impedance transform circuit 238 load modulates the 25Ω terminating impedance to a power saturating high efficiency impedance at the output of carrier amplifier device 236. This 25Ω-to-50Ω modulation of impedance transform circuit 238 classifies this topology as an "inverted" Doherty topology in order to differentiate it from non-inverting topologies that commonly use quarter-wave transmission line inverters between the power combine point and the output of the carrier amplifier match in order to modulate the output of the carrier amplifier impedance transform circuit between 50Ω and 100Ω in a similar design case—100Ω and 25Ω being inverses of each other in a 50Ω system.

In order to maintain an off-state impedance, $Z_{off\text{-}state}$, looking back into peaking amplifier device 216 from the power combine point 252 as high as possible and prevent power loss resulting from leakage back into the output of the peaking amplifier device over frequency while peaking amplifier stage 210, that is, peaking amplifier device 216, is in cutoff, frequency adjustable phase delay circuit 220 is used in combination with phase-matching transmission line 280, which provides a fixed offset phase adjustment, as well as a fixed interconnecting transmission line between the power combine point 252 and the output of impedance transform circuit 218 of peaking amplifier stage 210. The fixed offset phase adjustment of phase-matching transmission line 280 may be a simple parallel pair of transmission lines bridged by a capacitor that can slide to different positions in order to change phase for a fixed offset adjustment at the time of manufacture. Frequency adjustable phase delay circuit 220 can be implemented using a hybrid coupler phase shifter using affixed transmission lines and PIN diode tuning as depicted in FIG. 6 or using PIN diodes and varying lengths of transmission line as depicted in FIGS. 7 and 8.

Figure 5:
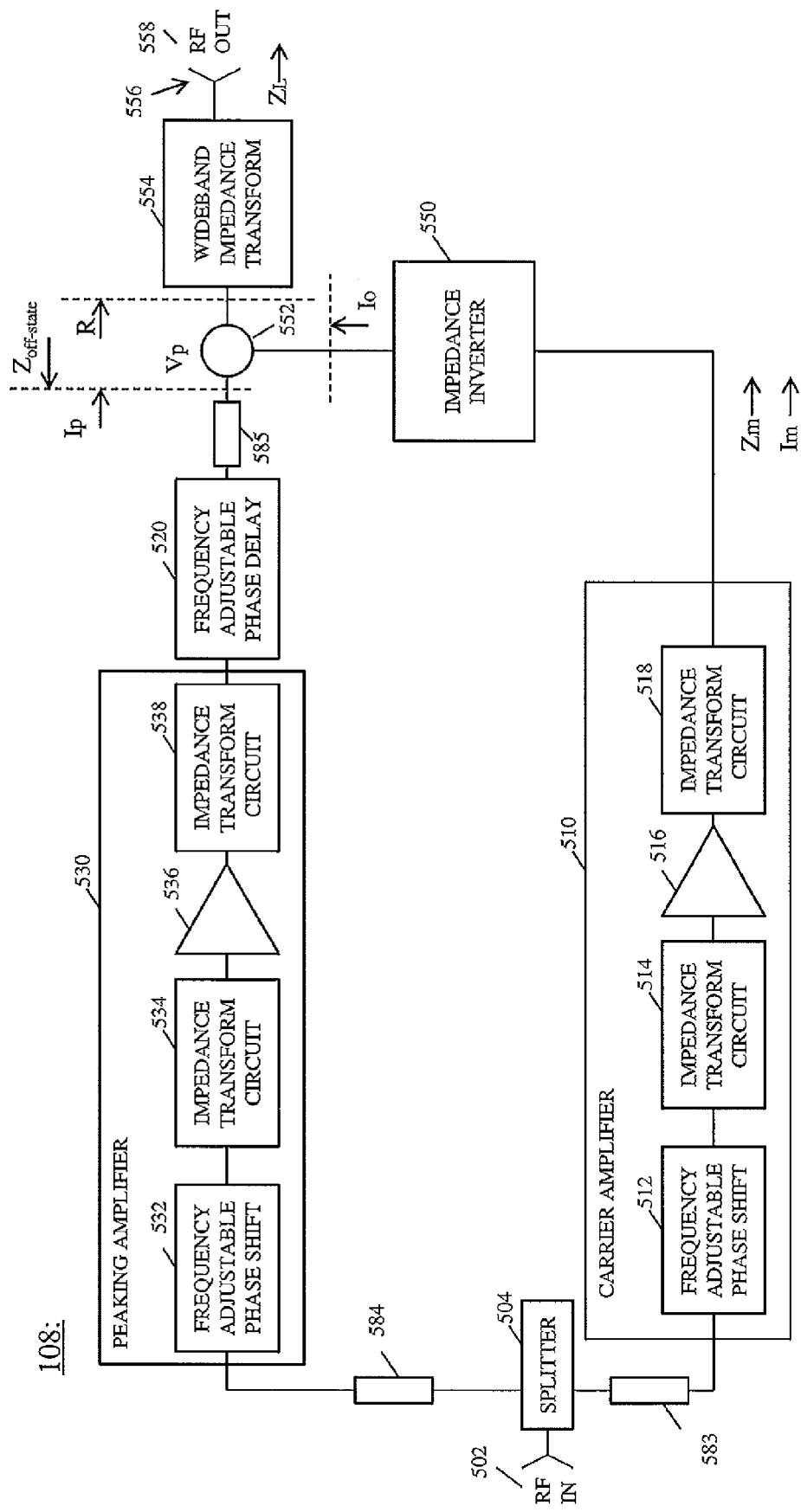
FIG. 5 is a block diagram of a radio frequency (RF) amplifier structure of the communication device of FIG. 1 in accordance with various other embodiments of the present invention.

In accordance with another embodiment of the present invention, a non-inverting Doherty topology, using many of the same functional elements as for the inverting Doherty topology of RF amplifier structure 108 as depicted in FIG. 2, may be used to construct RF amplifier structure 108, as depicted in FIG. 5. Similar to FIG. 2, the non-inverting Doherty topology of RF amplifier structure 108 depicted in FIG. 5 comprises two RF amplifier stages 510, 530 configured to operate in parallel, a signal splitter 504 that divides an RF input signal 502 into a first RF input signal and a second RF input signal and respectively routes the first and second RF input signals to an input of each of a first, carrier amplifier stage 510 and a second, peaking amplifier stage 530 of the two RF amplifier stages 510, 530, a frequency adjustable phase delay circuit 520 coupled to an output of peaking amplifier stage 530, and by means of phase offset 585 to a power combiner 552 (also referred to herein as power combine point 552) coupled, at its inputs, to an impedance inverter 550 and to frequency adjustable phase delay circuit 520 by means of phase offset 585. RF power amplifier structure 108 further comprises adjustable phase offset transmission lines 583, 584, and 585 that are respectively interposed between signal splitter 504 and the input of carrier amplifier stage 510, signal splitter 504 and the input of peaking amplifier stage 530, and frequency adjustable phase delay circuit 520 and power combiner 552.

Peaking amplifier stage 530 includes an RF peaking amplifier device 536 coupled, at an input, to an impedance transform circuit 534 that is, in turn, coupled to a frequency adjustable phase shift circuit 532. Peaking amplifier device 536 further is coupled, at an output, to an impedance transform circuit 538. Similarly, carrier amplifier stage 510 includes an RF carrier amplifier device 516 coupled, at an input, to an impedance transform circuit 514 that is, in turn, coupled to a frequency adjustable phase shift circuit 512, Carrier amplifier device 516 further is coupled, at an output, to an impedance transform circuit 518.

The non-inverting topology depicted in FIG. 5 utilizes a frequency variable impedance inverter 550, coupled between the output of carrier amplifier stage 510 and power combiner 552, to load modulate an impedance appearing at an output of impedance transform circuit 518 of carrier amplifier stage 510. Being a non-inverting topology, impedance inverter 550 load modulates impedance transform circuit 518 between an effective system impedance $Z_L$ while operating in parallel with peaking amplifier stage 530 during high power conditions and $2Z_L$ while the peaking amplifier stage is cutoff during low power conditions. Again, impedance transform circuit 518 must present a high power impedance match to the output of carrier amplifier device 516 while terminated in $Z_L$, and a high efficiency power saturating impedance match while terminated by impedance inverter 550 in twice the system impedance $2Z_L$ during cut off of peaking amplifier stage 530, that is, of peaking amplifier device 536. Rather than being limited by the frequency performance of a fixed quarter-wave transmission line for an impedance inverter, impedance inverter 550 uses a frequency variable phase shifter, such as the hybrid coupler phase shifter using PIN diode switched transmission lines as depicted in FIG. 6, the PIN diode driven frequency variable line phase shifter as depicted in FIGS. 7 and 8, or any number of other suitable frequency variable phase shifters. In order to be useful as an impedance inverter, the phase shifter must have broad frequency range over which it can be tuned to give approximately a 90 electrical degree phase shift needed for impedance inversion at the highest operational frequency of desired operation when load modulated at power combine point 552 through the self-rectification of the peaking amplifier device 536.

For example, in a non-obvious manner in the case of the hybrid coupler phase shifter using PIN diodes disposed along a transmission line in order to optimally tune for an odd multiple of 90 electrical degrees of phase rotation over frequency, the use of a hybrid coupler designed to be frequency response centered over the band of interest would incur significant additional signal loss because the phase shift will electrically be too long i.e. longer than the first minimum multiple of 90 electrical degrees required for impedance inversion at the highest frequencies of interest. Electrically if the insertion phase through a coupler is longer than the first minimum multiple of 90 electrical degrees then additional transmission line or an additional coupler must be appended to the first coupler so that the total electrical length of the inverter is rotated to the next odd multiple of 90 electrical degrees. Addition of a second coupler may double the insertion signal loss for the inverter and the addition of transmission line to achieve the next odd multiple of 90 degrees may be even worse. Therefore, in a preferred embodiment, impedance inverter 550 uses a broad band surface mount hybrid coupler frequency response centered at a higher frequency than the desired frequency of operation of RF amplifier structure 108 where the insertion phase through the coupler is less than the first minimum of an odd multiple of 90 electrical degrees with margin for the addition of appended external phasing lines and control elements in a structure such as shown in FIG. 6. In this manner, the non-inverting topology of RF amplifier structure 108 can be kept to a minimum of just two frequency adjustable phase elements 520 and 550 between the output of amplifier devices 536 and 516. Thus, the non-inverting topology of RF amplifier structure 108 depicted in FIG. 5 provides an output loss and a bandwidth advantage over non-inverted topologies which may be using more frequency variable tuning elements. The use of more elements than the minimum increases signal loss, required space for implementation, and reduces operational bandwidth.

The function and operation of the other elements in the non-inverting topology of RF amplifier structure 108 depicted in FIG. 5 is similar to that of the inverting topology of RF amplifier structure 108 depicted in FIG. 2. Frequency adjustable phase shift circuits 512 and 532 adjust the phase of RF input signal 502 through the carrier amplifier stage 510 and peaking amplifier stage 530 paths for maximal power at the power combine point 552 again using constructions such shown in FIGS. 6, 7, and 8.

For optimal bandwidth inverting and non-inverting requirement designs, wideband impedance transformers 254 and 554, respectively coupled between power combiners 252 and 552 and the system impedance $Z_L$, can be implemented using the microstrip asymmetric gap coupled transformer shown in FIG. 4 or a hybrid coupler phase shifter using transmission lines and/or in combination with pin diodes, capacitors, or switches as depicted in FIG. 6 but implemented using a characteristic impedance, $Z_o$, equal to the geometric mean between the system impedance, $Z_L$, at RF amplifier structure output 258/558 and the impedance R at power combine point 252/552, where R is usually set to $Z_L/2$ such that it implements an impedance inversion from the system impedance to the combine point impedance i.e. $Z_L/2=(Z_o)^2/Z_L$ and $Z_o=(Z_L*Z_L/2)^{1/2}$ over a significant frequency range. By way of example, in a common scenario, a 35Ω quarter-wave length transmission line for a 25-50Ω impedance transition would be replaced by a hybrid coupler-based frequency-adjustable phase delay circuit as depicted in FIG. 6 and controlled by processor 110 where the characteristic impedance of the coupler is 35 Ω.

As noted above, each RF amplifier stage 210, 230, 510, 530, includes a respective RF amplifier device 216, 236, 516, 536. Typically, the pair of RF amplifier devices 216 and 236, and the pair of RF amplifier devices 516 and 536, would be a same-type of active device (for example, a same type of RF power transistor), however that need not be the case. Depending upon the design of each RF power amplifier 216, 236, 516, 536, and the desired region of operation (for example, gain and frequency) of each of RF amplifier stages 210, 230, 510, and 530, each RF amplifier device 216, 236, 516, 536, may be coupled, at an input, to an output of a respective input impedance transforming circuit 214, 234, 514, 534, and/or, at an output, to an input of a respective output impedance transforming circuit 218, 238, 518, 538. In various embodiments of the present invention, one or more of impedance transforming circuits 214, 218, 234, 238, 514, 518, 534, and 538 may be designed into an integrated circuit (IC) package that includes the corresponding RF power amplifier 216, 236, 516, 536 or may be a discretely designed circuit that is separate from, that is, is external to, a transistor package that includes the corresponding RF power amplifier 216, 236, 516, 536.

Each impedance transforming circuit 214, 218, 234, 238, 514, 518, 534, 538 transforms a first impedance, at one end of the circuit, to a second, different impedance at the other end of the circuit. For example, impedance transforming circuits 214, 234, 514, 534 may be designed to transform an impedance at an input of each such circuit to a desired, for example, a matching, impedance at an input of their corresponding RF power amplifier 216, 236, 516, 536. Similarly, impedance transforming circuits 218, 238, 518, 538 may be designed to transform an impedance at an output of each such circuit to a desired, for example, a matching, impedance at an output of their corresponding RF power amplifier 216, 236, 516, 536.

That is, as is known in the art, RF power amplifiers typically provide desired performance when they see, at their input, a desired output impedance of a preceding network and, at their output, a desired input impedance of a succeeding network. These desired input and output impedances may be specified by a manufacturer of the RF power amplifier device or may be determined by experimentation. In order to present such a desired input and output impedance to an RF power amplifier, an RF amplifier structure such as RF amplifier structure 108 as depicted in FIGS. 2 and 5, may include an input impedance transforming circuit, such as input impedance transforming circuits 214, 234, 514, 534 at an input of the RF power amplifier, and/or an output impedance transforming circuit, such as output impedance transforming circuits 218, 238, 518, 538 at an output of the RF power amplifier. Typically such impedance transforming circuits are designed with fixed reactance components, which components have a reactance that is highly sensitive to frequency but are able to present a desired impedance to the corresponding RF amplifier over a sufficiently useful frequency range of operation.

In still other embodiments of the present invention, in addition to impedance inverter 550 depicted in FIG. 5, the RF amplifier structure 108 depicted in FIG. 5 may include an additional frequency adjustable phase shifter located between carrier amplifier stage 510 and power combiner 252.

The RF amplifier structure 108 depicted in FIGS. 2 and 5 is a Doherty-type amplifier, wherein first RF amplifier stages 230 and 510 are carrier amplifier stages and second RF amplifier stages 210 and 530 are peaking amplifier stages. Referring now to FIG. 2 and FIG. 5, in a Doherty-type amplifier embodiment, the operation of an RF amplifier structure 108 is as follows. RF power amplifier devices 236 and 516 in carrier RF amplifier stages 230 and 510 are biased with a quasi-linear class bias, such as AB, and RF power amplifiers 216 and 536 in peaking RF amplifier stages 210 and 530 are biased in a non-linear, highly efficient class bias, such as class B or class C. RF power amplifier devices 216 and 536 in peaking RF amplifier stages 210 and 530 are designed to turn on only when RF input signals 202 or 502 achieve a specified amplitude level that will keep carrier amplifier devices 236 and 516 sufficiently linear and out of hard power compression for a given application signal requirement.

Additionally, while peaking RF power amplifier devices 216 and 536 are cutoff during low power operation of the amplifier, carrier RF power amplifier devices 236 and 516 are run into an efficiency enhancing load. Peaking RF power amplifier devices 216 and 536 only turn on though self-rectification when RF input signal 202 or 502 in combination with the DC (Direct Current) gate/base bias voltage/current exceeds the device turn on threshold value of the peaking amplifier device, $v_{g\ peaking\ amplifier}$.

In practice, $V_{g\ peaking\ amplifier}$ is set so that the RF input signal 202 or 502 peaks do not saturate the carrier-peaking RF power amplifier combination, so that the transmitted (output) signal 258 or 558 remains sufficiently linear in order to be demodulated by a receiver.

Further, typically, in ideal two-stage Doherty, the RF amplifier structure 108 depicted in FIGS. 2 and 5 theoretically reaches its maximum efficiency at two points on a power drive-up curve. A first maximum efficiency point occurs when the carrier RF power amplifier devices 236 or 516 reach begin entering power saturation while the peaking RF power amplifiers 216 and 536 are still cut-off. A second maximum efficiency point occurs when both the carrier and peaking RF power amplifiers devices 216, 536, and 236, 516 are at their maximum peak power levels. That is, let a parameter 'α' correspond to a ratio of the voltage at a first efficiency maximum, $V_{bk}$, to a maximum voltage $V_M$ attainable from the combined output of the two RF power amplifiers, that is, $\alpha=V_{bk}/V_M$. Ideally, 'α' is chosen to maximize the average efficiency of the Doherty amplifier for a given RF input signal's 202, 302 envelope distribution by scaling the relative sizes of the carrier and peaking RF power amplifiers 236, 516 and 216, 536 as well as for the maximum combined peak power of the pair in accordance with required signal linearity required by a given application.

At low RF input signal levels 202, 502 that are, below the 'a' transition point, peaking RF power amplifier devices 216 and 536 are in "cut-off" since the composite combination of low input signal level and a DC bias voltage present on their gates/bases is below the turn on threshold of the devices and they do not supply current to output power combining points 252, 552. While the peaking amplifier devices 216 and 536 are cutoff, carrier RF power amplifier stages 230 and 510 are assumed to operate as a current sources into power saturating impedance loads at the input of their impedance transform circuits, 238/518. This saturating load causes carrier RF power amplifier devices 236 and 516 to operate more efficiently during cutoff of the peaking amplifiers 216 and 536. This forced pre-mature saturation causes the first efficiency maximum to occur at the chosen targeted ratio '$\alpha$'$=V_{bk}/V_M$ which depends upon the relative electrical sizing of the peaking and carrier amplifiers.

After saturation, the output voltage, $V_m$, of the carrier amplifier devices 236 and 516 becomes equivalent to a constant voltage source throughout the remainder of an input power drive up.

Starting from the α transition point, peaking RF power amplifier devices 216 and 536 begin to turn on as function of both a power level of RF input signal 202/502 and the DC bias present on the gate/base of the peaking RF power amplifier. As this happens, peaking RF power amplifier stages 210/530 begin to supply additional current-into the power combine point, 252/552. This additional current causes the effective load seen by the carrier amplifier devices 236/516 at the inputs of their impedance transform circuits 238/518 to transition from a highly efficient power saturating load for low power operation to a load suitable for high power operation.

Doherty amplifiers are very sensitive to variations in these load impedances. That is, in order to optimize the power of the RF signal output by RF power amplifiers 216/536 and 236/516 and applied to power combiners 252/552, in the prior art an output matching circuit, such as output impedance transforming circuits 218, 238, 518, 538 was designed to transform an output impedance of the RF amplifier to an input impedance with respect to the signal combiner. In other words, an output matching circuit is designed to present, at an output of the RF power amplifier, a load impedance that is matched the output impedance of the RF power amplifier. Similarly, in order to optimize the power of the RF signal applied to a RF power amplifier, such as RF power amplifiers 216, 236, 516, and 536 in the prior art matching circuits, such as input impedance transforming circuits 214, 234, 514, and 534 are designed to transform an output impedance of a signal splitter, such as signal splitter 204/504, to an input impedance at an input of the RF power amplifier. That is, an input matching circuit is designed to present, to RF power amplifier, an output impedance that matches the input impedance of the RF power amplifier. Typically, such input and output matching circuits are designed using fixed components, such as capacitors, inductors, and transmission lines, that have a frequency-responsive reactance and/or inductance. As the frequency of RF input signal 202/502 varies, so would the impedances of input matching circuits 214, 234, 514, and 534 and output matching circuits 218, 238, 518, and 538, correspondingly, the load impedances presented to RF power amplifier devices 216, 236, 516, and 536. Thus an input or output match that may provide an optimal match within a very narrow frequency range quickly becomes a sub-optimal match outside of that frequency range.

Furthermore, in the prior art, circuits such as phase offset circuits 206, 280, 281, 583, 584, and 585 and impedance inverter 550 are designed to provide for an optimal alignment, at power combiners 252/552, of the signal passing through peaking amplifier stages 210/530 with the signal passing through carrier amplifier stage 230/510, so that the signals are constructively, as opposed to destructively, combined. However, again, such input and output matching circuits are designed using fixed components, such as transmission lines, that have a frequency-responsive phase delay and that provide for constructive combining only within a very narrow frequency range that quickly becomes sub-optimal outside of that frequency range.

Accordingly, in order to provide for wideband matching and constructive combining, RF amplifier structure 108 uses ultra-wide frequency range RF power amplifier devices, such as Gallium Nitride (GaN) transistors, SiC, or other high tension transistors having low parasitic output capacitance, as the RF power amplifier devices of RF power amplifiers 216, 236, 516, and 536, along with controllable, frequency-adjustable Doherty circuit elements, that is, elements whose reactance may be controllably-adjusted based on a frequency of RF input signal 202/502 to maintain an optimal match and/or phase delay across a wide range of frequencies, thereby extending the useful high efficiency frequency range RF amplifier structure 108 into multiple bands of operation. More particularly, RF amplifier structure 108 employs controllable, frequency-adjustable phase delay circuits 212, 220, 232, 512, 532, 520, and 550, utilizing switching devices, such as PIN diodes, and further utilizing, in some embodiments, hybrid couplers, to extend a frequency range of RF power amplifiers 216, 236, 516, and 536. As a result, RF amplifier structure 108 can provide coverage over multiple frequency bands, such as the GSM (Global System for Mobile communications) 1800 MHz (Megahertz), PCS (Personal Communications Service) 1900 MHz, and UMTS (Universal Mobile Telecommunications System) 2100 MHz bands, or the 700 MHz, 800 MHz, and 900 MHz bands, utilizing only a single set of amplifying elements, that is, RF power amplifiers 216, 236 or 516, 536 and matching circuits 214, 218, 234, 238, or 514, 518, 534, 538 when the prior art would have required combining a multiple number of single-band Doherty amplifiers, thereby reducing a size, weight, and material cost associated the construction of multi-band multi-mode capable communications equipment.

That is, in order to provide a wideband frequency range of operation, each of RF amplifier stage 210, 230, 510, 530 includes or is coupled to one or more controllable, frequency-adjustable phase delay circuits 212, 220, 232, 512, 532, 520, and 550. For example, peaking amplifier stage 210/530 may include one or more of a first frequency-adjustable phase delay circuit 212/532 coupled to an input of peaking amplifier device 216/536 or to an input of an intervening input impedance transforming circuit 214/534, and a second frequency-adjustable phase delay circuit 220/520 coupled to an output of peaking amplifier device 216/536 or to an output of an intervening output impedance transforming circuit 218/538. Similarly, carrier amplifier stage 230/510 may include, or be coupled to, one or more of a frequency-adjustable phase delay circuit 232/512 coupled to an input of carrier amplifier device 236/516 or to an input of an intervening input impedance transforming circuit 234/514, and an output impedance transforming circuit 238/518 coupled to an output of carrier amplifier device 236/516. Similarly, one or more of phase offset circuits 206, 280, 281, 583, 584, and 585, and impedance inverter 550 also may comprise a controllable, frequency-adjustable phase delay circuit in order to further optimize alignment, at power combiner 252/552, of the signals passing through RF amplifier stages 210, 230, 510, and 530, so that the signals are constructively, as opposed to destructively, combined.

Frequency-adjustable phase delay circuits 212, 220, 232, 512, 520, 532, and 550 facilitate wideband amplification of RF input signal 202/502 by allowing for a retuning of impedance transformations at the input and output of corresponding amplifier devices 216, 236, 516, 536 based on a frequency of the RF input signal. That is, as discussed in greater detail below, each of frequency-adjustable phase delay circuits 212, 220, 232, 512, 520, 532, and 550 comprises one or more variable length transmission lines whose effective lengths, and associated phase delay and reactance, can be adjusted by processor 110 based on a frequency of RF input signal 202/502, consumed supply power, output RF power level, operating temperature, etc. For example, processor 110 may through communication with various tuning elements such as PIN diodes, switches, etc. vary the effective electrical length of various interconnecting transmission line elements so as to optimize their characteristics for operation over multiple frequency bands and rages of operation as well as other operating conditions such as temperature and power or the processor may adjust an effective length of the variable length transmission lines in any way determined by experimentation, in order to maintain optimal input and output matches, or impedance transformations, across a wider range of frequencies than was provided by input and output matching circuits of the prior art. Similarly, one or more of phase offset circuits 206, 280, 281, 583, 584, and 585 and impedance inverter 550, also may comprise a controllable, frequency-adjustable phase delay circuit having one or more variable length transmission lines whose effective lengths, and associated phase delay, can be adjusted by processor 110 based on a frequency of RF input signal 202/502 or other desirable operating conditions in order to facilitate optimal combining of the signals passing through RF amplifier stages 210, 230, 510, 530 at power combine points 252/552 through to wideband transformers 254/554.

Referring now to FIG. 6, a block diagram is provided of a controllable, frequency-adjustable phase delay circuit 600, such as frequency-adjustable phase delay circuits 212, 220, 232, 512, 532, 520, and 550, in accordance with a 'hybrid-coupler' embodiment of the present invention. Frequency-adjustable phase delay circuit 600 comprises a hybrid-coupler 640 having an RF signal input port 602, an RF signal transmitted, or output, port 604, and coupled ports 606 and 608. Each of coupled ports 606 and 608 is in communication with a respective variable length transmission line 610, 620. In turn, each variable length transmission line 610, 620 comprises a respective transmission line 612, 622 of a pre-determined length that is coupled to a respective bank of multiple shunt (to ground) switching devices, that is, a first bank of one or more switching devices $614_1$-$614_n$ that are coupled to, and are distributed at various distances along a length of, transmission line 612 and a second bank of one or more switching devices $624_1$-$624_n$ that are coupled to, and distributed along a length of, transmission line 622. Thus, by selectively activating a switching device of the one or more shunt switching devices $614_1$-$614_n$, the electrical length of transmission line 612 may be adjusted (for example, terminated at the activated switching device) and by selectively activating a switching device of the one or more shunt switching devices $624_1$-$624_n$, the electrical length of transmission line 622 may be adjusted.

Preferably, each switching device $614_1$-$614_n$, $624_1$-$624_n$ is a PIN diode, although any type of switching device may be employed here as the type of switching device used is not critical to the invention consistent with appropriate power handling and signal linearity.

Due to internal parasitic line lengths contained in the construction of commonly used hybrid couplers between component pads and actual coupled elements, frequency-adjustable phase delay circuit 600 when used in an impedance inversion application such as impedance inverter 550 is chosen or designed to be band-centered or electrically equivalent to less than an odd multiple of 90 electrical degrees through its input and output ports 602 and 604 at a frequency that is slightly above the highest frequency band of operation of RF amplifier structure 108. In this manner, frequency-adjustable phase delay circuit 600 can be tuned for impedance inversion applications such as impedance inverter 550 using switching elements disposed along the effectively variable transmission lines 612/622 external to the coupler in order to achieve odd-multiples of 90 electrical degrees over frequency bands of interest less than the maximum frequency of desired operation. Otherwise, the coupler will always be too electrically long in order to achieve proper impedance inversion with minimal signal loss, minimal size, and maximum bandwidth.

Each switching device $614_1$-$614_n$, $624_1$-$624_n$ is controlled by, that is, is activated and deactivated, by processor 110 and is coupled to ground. When activated by processor 110, each switching device $614_1$-$614_n$, $624_1$-$624_n$ provides a ground termination for the corresponding transmission line 612, 622 at the location of the switching device. Thus, by selectively activating switching devices $614_1$-$614_n$ with respect to transmission line 612, and switching devices $624_1$-$624_n$ with respect to transmission line 622, processor 110 may adjust an effective electrical length and a corresponding reactance and phase shift of each transmission line 612, 622 and thereby controllably adjust a phase delay and reactance of frequency-adjustable phase delay circuit 600.

Referring now to FIGS. 7 and 8, block diagrams are provided of a frequency-adjustable phase delay circuit 700, 800, such as frequency-adjustable phase delay circuits 212, 220, 232, 512, 520, 532, and 550, in accordance with another embodiment of the present invention. Frequency-adjustable phase delay circuits 700 and 800 are 'switched transmission line' embodiments wherein the frequency-adjustable phase delay circuit comprises multiple connected transmission lines that can be switched in and out in order to adjust the phase delay based on a frequency of RF input signal 202/502 or other tuning optimization such as for power efficiency, linearity, etc.

More particularly, frequency-adjustable phase delay circuit 700 may be thought of as a transmission line ladder. On an input side of the frequency-adjustable phase delay circuit, an input port 702 is coupled to an input transmission line 704. In turn, input transmission line 704 is coupled to a first, input set of multiple, serially-connected transmission lines $712_1$-$712_n$ by a first switching device $722_1$ of a first, input set of switching devices $722_1$-$722_n$ Each of the serially-connected input transmission lines of the first set of serially-connected transmission lines $712_1$-$712_n$ is connected to a next transmission line of the set of serially-connected input transmission lines $712_1$-$712_n$ by a respective switching device of the first set of switching devices $722_1$-$722_n$ that is interposed between the transmission lines. For example, a first transmission line $712_1$ of the first set of transmission lines $712_1$-$712_n$ is serially coupled to a second transmission line $712_2$ of the first set of transmission lines $712_1$-$712_n$ by a second switching device $722_2$ of the first set of switching devices $722_1$-$722_n$, second input transmission line $712_2$ is serially coupled to a third input transmission line (not shown) of the first set of transmission lines $712_1$-$712_n$ by a third switching device $722_3$ of the first set of switching devices $722_1$-$722_n$, and so on.

On an output side, frequency-adjustable phase delay circuit 700 comprises an output port 754 that is coupled to an output transmission line 752. In turn, output transmission line 752 is coupled to a second, output set of multiple, serially-connected output transmission lines $732_1$-$732_n$ by a first switching device $742_1$ of a second, output set of switching devices $742_1$-$742_n$. Each of the serially-connected transmission lines of the second set of serially-connected transmission lines $732_1$-$732_n$ is connected to a next transmission line of the second set of serially-connected output transmission lines $732_1$-$732_n$ by a respective switching device of the second set of switching devices $742_1$-$742_n$ that is interposed between the transmission lines. For example, a first transmission line $732_1$ of the second set of transmission lines $732_1$-$732_n$ is serially coupled to a second transmission line $732_2$ of the second set of transmission lines $732_1$-$732_n$ by a second switching device $742_2$ of the second set of switching devices $742_1$-$742_n$, second transmission line $732_2$ is serially coupled to a third transmission line (not shown) of the second set of transmission lines $732_1$-$732_n$, by a third switching device $742_3$ of the second set of switching devices $742_1$-$742_n$, and so on. Thus, the multiple, serially connected input transmission lines $712_1$-$712_n$ and the multiple, serially connected output transmission lines $732_1$-$732_n$ may be thought of as the stringers of the ladder.

Further, each transmission line of the first, input set of serially-connected transmission lines $712_1$-$712_n$ is connected to a corresponding transmission line of the second, output set of serially-connected transmission lines $732_1$-$732_n$ by one or more switching devices of a third, interconnecting set of switching devices $761_1$-$761_r$ to thereby provide a connecting circuit across the frequency-adjustable phase delay circuit. For example, a distal end of first input transmission line $712_1$ is coupled to a distal end of first output transmission line $732_1$ by a first pair of interconnecting switching devices $761_1$-$761_2$, a distal end of second input transmission line $712_2$ is coupled to a distal end of second output transmission line $732_2$ by a second pair of interconnecting switching devices $761_3$-$761_4$, and so on. Thus, each pair of interconnecting switching devices $761_1$-$761_r$ may be thought of as the rungs of the ladder.

Each of the first, second, and third sets of switching devices, $722_1$-$722_n$, $742_1$-$742_n$, $761_1$-$761_r$, is controlled by, that is, is activated and deactivated, by processor 110. By selectively activating and/or deactivating one or more switching devices of each of the first, second, and third sets of switching devices, $722_1$-$722_n$, $742_1$-$742_n$, $761_1$-$761_r$, processor 110 may controllably adjust an overall length, and corresponding reactance and phase delay, of the ladder, that is, of frequency-adjustable phase delay circuit 700.

The last input and output transmission lines $712_n$ and $732_n$ of the multiple, serially connected input and output transmission lines $712_1$-$712_n$ and $732_1$-$732_n$ then may be connected at their distal ends by a last pair of interconnecting switching devices (not shown) or by an interconnecting transmission line 770. In addition, at the base of the ladder, input transmission line 704 is coupled to output transmission line 752 by one or more switching devices 706, 708 (two shown). Thus processor 110 may, by selectively activating switching devices 706, 708, bypass the ladder when appropriate.

For example, suppose processor 110 determines to include only first input transmission line $712_1$ and corresponding first output transmission line $732_1$ in frequency-adjustable phase delay circuit 700. Processor 110 then would activate switching device $722_1$ of the first set of switching devices $722_1$-$722_n$, switching device $742_1$ of the second set of switching devices $742_1$-$742_n$, and switching devices $731_1$ and $731_2$ of the third set of switching devices $732_1$-$732_r$, and would not activate or would deactivate (whichever is appropriate) switching devices 703, 708, $722_2$, and $742_2$. A signal passing through frequency-adjustable phase delay circuit 700 then would enter at input port 702 and pass through input transmission line 704, switching device $722_1$, input transmission line $712_1$, switching devices $731_1$ and $731_2$, output transmission line $732_1$, switching device $742_1$, and output transmission line 752, and then output at output port 754.

By way of another example, suppose processor 110 determines to lengthen frequency-adjustable phase delay circuit 700 by further including second input transmission line $712_2$ and second output transmission line $732_2$ in frequency-adjustable phase delay circuit 700. Processor 110 then would activate switching devices $722_1$ and $722_2$ of the first set of switching devices $722_1$-$722_n$, switching devices $742_1$ and $742_2$ of the second set of switching devices $742_1$-$742_n$, and switching devices $761_3$ and $761_4$, of the third set of switching devices $762_1$-$762_r$, and would not activate or would deactivate (whichever is appropriate) switching devices 703, 708, $722_3$, $742_3$, $761_1$, and $761_2$. A signal passing through frequency-adjustable phase delay circuit 700 then would enter at input port 702 and pass through input transmission line 704, switching device $722_1$, input transmission line $712_1$, switching device $722_2$, input transmission line $712_2$, switching devices $761_3$ and $761_4$, output transmission line $732_2$, switching device $742_2$, output transmission line $732_1$, switching device $742_1$, and output transmission line 752, and then output at output port 754.

Thus, by selectively activating switching devices 706, 708, $722_1$-$722_n$, $742_1$-$742_n$, and $731_1$-$731_r$, processor 110 may adjust a length and a corresponding reactance and phase delay of frequency-adjustable phase delay circuit 700. However, one may note that an advantage of the hybrid coupler-based design of frequency-adjustable phase delay circuit 600 over the switched transmission line design of frequency-adjustable phase delay circuit 700 is that, in the event of a switching device failure, the signal path in the switched transmission line design will be broken due to the series connection of the PIN diode. In the coupler based design, a PIN diode failure will only result in a non-optimal tune for efficiency. This can be an important consideration in designs where high reliability is required.

Preferably, each switching devices 706, 708, $722_1$-$722_n$, $742_1$-$742_n$, and $731_1$-$731_r$ are a PIN diodes, although any high frequency switching device may be employed here as the type of switching device used is not critical to the invention consistent with appropriate power handling and signal linearity.

In yet another alternative embodiment, circuit 800 of FIG. 8 creates a paralleled network of switchable interconnected transmission lines in order to realize an adjustable phase delay circuit that could be controlled by processor 110 as frequency-adjustable phase delay circuits 212, 220, 232, 512, 520, 532, and 550, in accordance with another embodiment of the present invention.

Communication device 100 uses one or more adjustable phase delay circuits 212, 232, 512, and 532 to make an insertion phase for carrier RF power amplifiers 230/510 and peaking RF power amplifiers 210/530 equal from the input signal splitter 204/504 to output power combiner 252/552. In order to make these phase delay circuits frequency adjustable, each one of these phase delay circuits 212, 232, 512, and 532 also may be constructed in a manner similar to frequency-adjustable phase delay circuits 600, 700, or 800, whose phase delay and reactance can be controlled by processor 110 based on a frequency of RF input signal 202/502 as described above. In order to achieve optimal bandwidth, in various embodiments of the present invention, these phase delay circuits may be placed either/or at the input of the peaking RF amplifier stage 210/530 or at the input of carrier RF amplifier stage 230/510 in a manner that minimizes the insertion phase required for in-phase power combining at output power combiner 252/552. For example, a phase delay circuit could be placed at the input of peaking RF amplifier stage 210/530 in order to equalize the phase shift through the carrier RF amplifier path 230/510 to the power combine point 252/552. However, if a significant phase shift is required by a peaking RF power amplifier output phasing line (not shown), the frequency-adjustable phase delay circuit may instead be placed before at the input to carrier RF amplifier stage 230/510. Further, a generalized design might have a frequency-adjustable phase delay circuit at the inputs to both the peaking RF amplifier stage 210/530 and the carrier RF amplifier stage 230/510, but may operate with a reduced bandwidth while operating in a particular frequency range due to the cascading effect of serially combining additional band limited elements.

For the input signal splitter 204/504, use of an equal-phase split element or a frequency difference element, such as a 90 degree or 180 degree splitter, as appropriate may operate to reduce a physical size of additional transmission line lengths required in a particular situation.

In still other embodiments of the present invention, RF amplifier structure 108 may include a peaking RF power amplifier phasing line that prevents the leakage of power appearing at power combiner 252/552 from bleeding back into the output of peaking RF amplifier device 216/536 while the peaking amplifier device is in cutoff mode and not contributing current to power combiner 252/552. The peaking RF power amplifier frequency adjustable phase delay, 220/520 helps maintain high efficiency operation of the RF amplifier structure 108 over frequency by adjusting the effective electrical length between the output of peaking amplifier stages 210/530 and power combiner 252/552 such that the impedance at the power combiner looking back towards the peaking amplifier device output is at least 5 to 10 times higher than the impedance seen at the power combiner looking into wideband impedance transformer 254/554. In this manner, the power output by carrier amplifier stage 230/510 will proceed to the output of RF amplifier structure 108 rather than leaking away back into the output of peaking amplifier stage 210/530. In such embodiments, and referring to FIGS. 2 and 5, frequency-adjustable phase delay circuits 220/520 may function as such a peaking RF power amplifier phasing line, where either the switched line lengths technique as described with reference to frequency-adjustable phase delay circuits 700 and 800, or the hybrid-combiner based technique as described with reference to frequency-adjustable phase delay circuit 600, may be used.

Figure 9A:
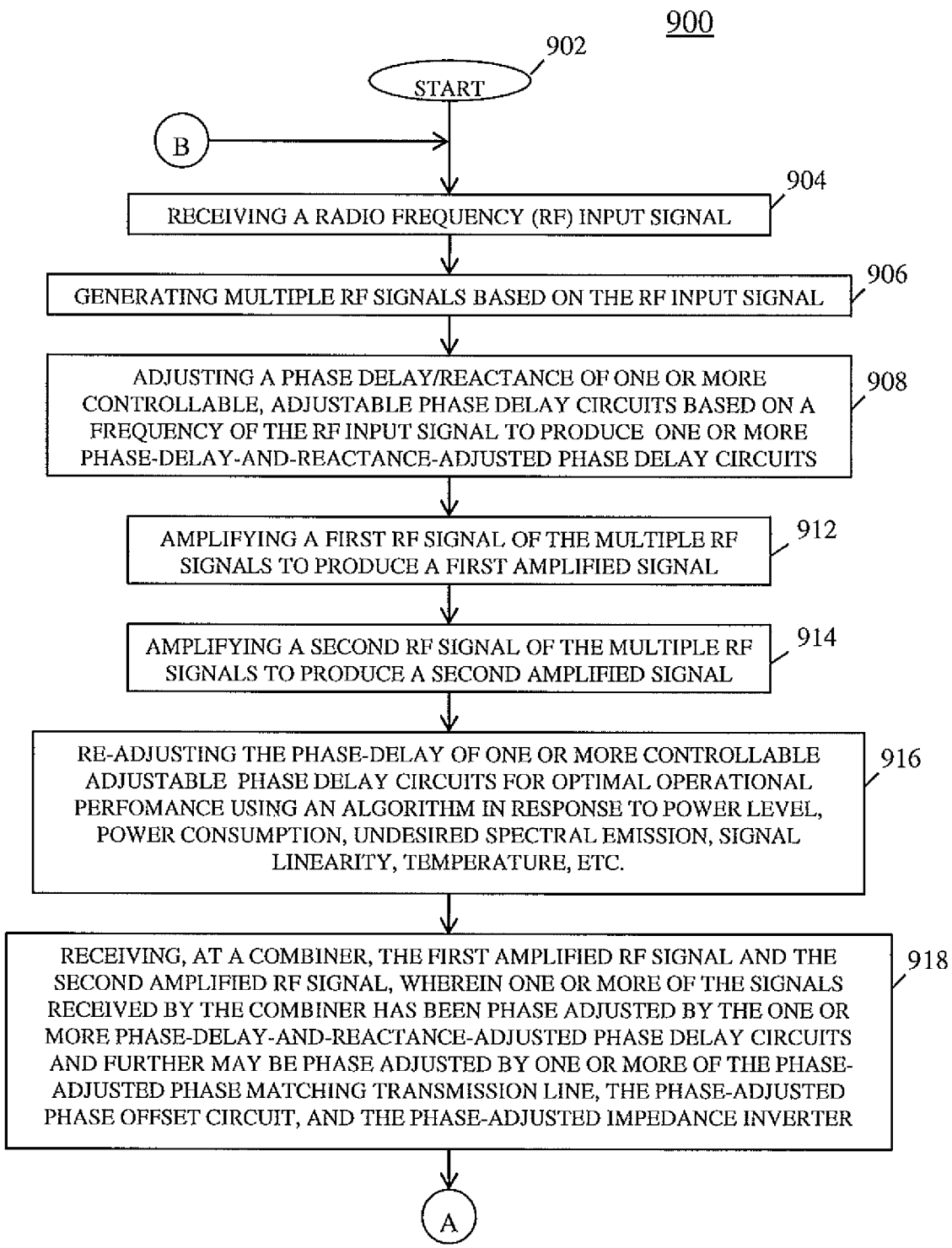
FIG. 9A is a logic flow diagram of a method performed by the RF amplifier structure of the communication device of FIG. 1 in amplifying an RF signal in accordance with various embodiments of the present invention.
Figure 9B:
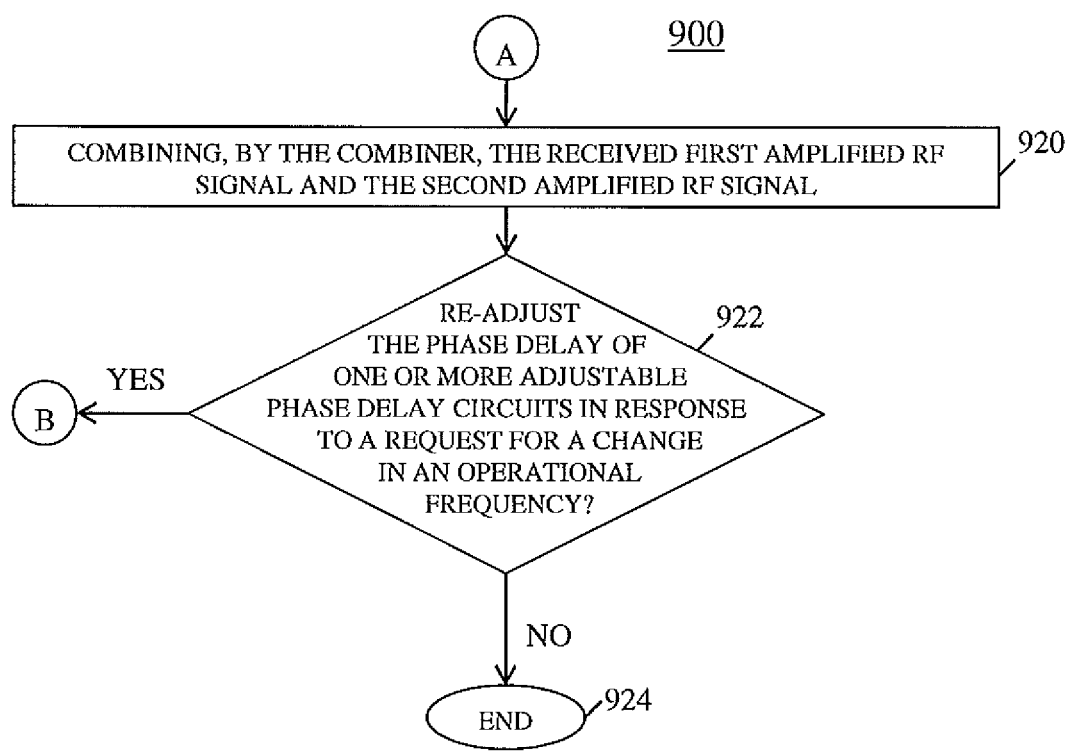
FIG. 9B is continuation of the logic flow diagram of FIG. 9A depicting of a method performed by the RF amplifier structure of the communication device of FIG. 1 in amplifying an RF signal in accordance with various embodiments of the present invention.

Referring now to FIGS. 9A and 9B, a logic flow diagram 900 is provided that illustrates a method by which communication device 100, and in particular RF amplifier structure 108, amplifies an RF signal, that is, RF input signal 202/502, in accordance with various embodiments of the present invention. With reference to FIGS. 2, 5, 9A, and 9B, logic flow diagram 900 begins (902) when signal splitter 204/504 receives (904) RF input signal 202/502 and generates (906)

multiple RF signals based on the RF input signal. Further, processor 110 of communication device 100 adjusts (908) a phase delay and a reactance of one or more controllable, adjustable phase delay circuits, such as any of frequency adjustable phase delay circuits 212, 220, 232, 512, 520, 532, and 550, based on a frequency of RF input signal 202/502, to produce one or more phase-delay-and-reactance-adjusted phase delay circuits.

RF amplifier structure 108 then routes a first RF signal of the multiple RF signals to first RF amplifier stage 230/510, which amplifies (912) the first RF signal of the multiple RF signals to produce a first amplified RF signal based on the first RF signal. RF amplifier structure 108 further routes a second RF signal of the multiple RF signals to second RF amplifier stage 210/530, which amplifies (914) the second RF signal of the multiple RF signals to produce a second amplified RF signal based on the second RF signal. RF amplifier structure 108 may also re-adjust (916), by use of the one or more phase-delay-and-reactance-adjusted phase delay circuits 212, 220, 232, 512, 520, 532, and 550, a phase of one or more of the signals amplified by first RF amplifier stage 230/510, or second RF amplifier stage 210/530, in order to optimize the amplifier performance for changing conditions such as signal power level, power supply consumption, and temperature in accordance with an operational algorithm used by processor 110 and stored in memory 112.

Power combiner 252/552 receives (918) the signal amplified by first RF amplifier stage 230/510 and the signal amplified by second RF amplifier stage 210/530, as phase-adjusted by the one or more of the phase-delay-and-reactance-adjusted phase delay circuits 212, 220, 232, 512, 520, 532, and 550, and combines (920) the received signals.

RF amplifier structure 108 also may re-adjust (922), by use of the one or more phase-delay-and-reactance-adjusted phase delay circuits 212, 220, 232, 512, 520, 532, and 550, a phase of one or more of the signals amplified by first RF amplifier stage 210/530, or of one or more of the signals amplified by second RF amplifier stage 230/510, in response to a request for a change in the operational frequency from a user through the operating algorithm used by processor 110 and stored in memory 112. Logic flow 900 then ends (924).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A radio frequency (RF) amplifier structure comprising:
a signal splitter that is configured to receive an RF input signal and produce a plurality of RF signals based on the RF input signal;
a first RF amplifier stage having a first RF amplifier device coupled to a first output impedance transforming circuit, wherein the first RF amplifier stage is configured to receive a first RF signal of the plurality of RF signals and produce a first amplified RF signal based on the first RF signal;
a second RF amplifier stage having a second RF amplifier device coupled to a second output impedance transforming network, wherein the second RF amplifier stage is configured to receive a second RF signal of the plurality of RF signals and produce a second amplified RF signal based on the second RF signal;
a power combiner that is configured to combine the first amplified RF signal and the second amplified RF signal to produce an output signal;
an output matching impedance transform circuit coupled between an output of the first amplifier device and the power combiner, wherein the output matching impedance transform circuit comprises a low pass multiple section inductance-capacitance circuit and provides impedance matching between the output of the first amplifier device and the power combiner, wherein the output matching impedance transform circuit has approximately an odd multiple of 90 electrical degrees over the RF amplifier structure's frequency range of operation in order to enable impedance inversion between the power combiner and the output of the first amplifier device such that an impedance presented by the output impedance transform circuit to the first amplifier device will be load modulated between a highly efficient power saturating impedance when the second amplifier device is in cutoff and a non-power saturating impedance which delivers high power to the power combiner when the second amplifier device is biased on;

an adjustable phase delay circuit succeeding the second RF amplifier device that receives the second amplified RF signal and routes the second amplified RF signal to the power combiner; and wherein a phase delay and a reactance of the adjustable phase delay circuit is controllably adjusted based on a frequency of the RF input signal and minimizes a flow of power from the power combiner back into the output of the second amplifier device when the second amplifier device is in cutoff while allowing power flow from the second amplifier device to the power combiner when the second amplifier device is biased on.

2. The radio frequency (RF) amplifier structure of claim 1, wherein the adjustable phase delay circuit is a first adjustable phase delay circuit and wherein the RF amplifier structure further comprises one or more of:

a second adjustable phase delay circuit preceding the first RF amplifier and that receives the first RF signal and routes the first RF signal to the first RF amplifier;

a third adjustable phase delay circuit preceding the second RF amplifier and that receives the second RF signal and routes the second RF signal to the second RF amplifier; and wherein a phase delay and a reactance of one or more of the second adjustable phase delay circuit and the third second adjustable phase delay circuit is controllably adjusted based on a frequency of the RF input signal.

3. The radio frequency amplifier structure of claim 2, wherein the adjustable phase delay circuit comprises a plurality of switched reactance elements.

4. The radio frequency amplifier structure of claim 3, wherein each switched reactance element of the plurality of switched reactance elements comprises a shunt switched variable length transmission line.

5. The radio frequency amplifier structure of claim 4, wherein each shunt switched variable length transmission line comprises a transmission line coupled to one or more shunt switching devices that are distributed at various distances along a length of the transmission line.

6. The radio frequency amplifier structure of claim 4, wherein the adjustable phase delay circuit further comprises a hybrid coupler having a coupled port and an isolated port, and wherein each port of the coupled port and the isolated port is coupled to a shunt switched variable length transmission line.

7. The radio frequency amplifier structure of claim 3, wherein the plurality of switched reactance elements comprises:

a first plurality of serially-connected transmission lines;

a second plurality of serially-connected transmission lines in parallel with the first plurality of serially-connected transmission lines;

a first set of switching devices, wherein each switching device of the first set of switching devices serially connects a transmission line of the first plurality of serially-connected transmission lines to a next transmission line of the first plurality of serially-connected transmission lines;

a second set of switching devices, wherein each switching device of the second set of switching devices serially connects a transmission line of the second plurality of serially-connected transmission lines to a next transmission line of the second plurality of serially-connected transmission lines; and a third set of switching devices, wherein each switching device of the third set of switching devices connects a transmission line of the first plurality of serially-connected transmission lines to a transmission line of the second plurality of serially-connected transmission lines.

8. The radio frequency (RF) amplifier structures of claim 1, wherein the RF amplifier structure comprises a Doherty amplifier, wherein the first RF amplifier stage is a carrier amplifier stage, and wherein the second RF amplifier stage is a peaking amplifier stage.

9. The radio frequency (RF) amplifier structures of claim 1, further comprising one or more of:

a phase matching transmission line interposed between the signal splitter and the second RF amplifier stage;

a phase offset circuit interposed between the signal splitter and the first RF amplifier stage, the signal splitter and the second amplifier stage, or the adjustable phase delay circuit and the power combiner;

an impedance inverter interposed between the first RF amplifier stage output impedance transform circuit and the power combiner.

10. The radio frequency (RF) amplifier structure of claim 9, wherein a phase delay of one or more of the phase matching transmission line, the phase offset circuit, and the impedance inverter can be controllably adjusted based on the frequency of the RF input signal.

11. The radio frequency (RF) amplifier structure of claim 9, wherein the impedance inverter comprises a hybrid coupler that is band-centered at a frequency that is above a highest frequency of operation of the RF amplifier structure so that the hybrid coupler's insertion phase when configured as a phase shifter can be made approximately an odd multiple of 90 electrical degrees over a chosen frequency band of operation when external transmission lines and switching elements are coupled to phasing ports of the impedance inverter.

12. The radio frequency (RF) amplifier structure of claim 1, wherein the wideband impedance transformer comprises one or more of:

a printed line asymmetrical gap coupled microstrip transformer;

a hybrid coupler based frequency variable phase shifter based design having an effective characteristic impedance approximately equivalent to the geometric mean between the combine point impedance and the system impedance that the amplifier output is connected to; and an un-balanced to un-balanced balun type transformer.

13. A wireless communication device capable of amplifying a radio frequency (RF) signal, the wireless communication device comprising a processor coupled to the radio frequency (RF) amplifier structure of claim 1, wherein the processor is configured to controllably adjust a phase delay and a reactance of the adjustable phase delay circuit by one or more of:

activating one or more switching devices of the adjustable phase delay circuit based on a frequency of the RF input signal; and deactivating one or more switching devices of the adjustable phase delay circuit based on a frequency of the RF input signal.

14. A radio frequency (RF) amplifier structure comprising:

a signal splitter that is configured to receive an RF input signal and produce a plurality of RF signals based on the RF input signal;

a first RF amplifier stage having a first RF amplifier device coupled to a first output impedance transforming circuit, wherein the first RF amplifier stage is configured to receive a first RF signal of the plurality of RF signals and produce a first amplified RF signal based on the first RF signal;

a second RF amplifier stage having a second RF amplifier device coupled to a second output impedance transforming network, wherein the second RF amplifier stage is configured to receive a second RF signal of the plurality of RF signals and produce a second amplified RF signal based on the second RF signal;

a power combiner that is configured to combine the first amplified RF signal and the second amplified RF signal to produce an output signal;

a low pass multiple section inductance-capacitance output matching impedance transform circuit coupled to the output of the first amplifier device and the power combiner and that provides impedance matching at the output of the first amplifier device;

a first adjustable phase delay circuit coupled to an output of the output matching impedance transform circuit and the power combiner and that receives the first amplified RF signal from the output impedance transform circuit and routes the first amplified RF signal to the power combiner, wherein the first adjustable phase delay circuit is controllably adjusted based on a frequency of the RF input signal and is approximately an odd multiple of 90 electrical degrees over an operating frequency range of the first adjustable phase delay circuit, wherein the first adjustable phase delay circuit provides impedance inversion between the power combiner impedance and the output impedance transform circuit such that the impedance presented by the output impedance transform circuit to the first amplifier device will be load modulated between by a highly efficient power saturating impedance when the second amplifier device is in cutoff and a non-power saturating impedance which delivers high power to the power combiner through the adjustable phase delay circuit when the second amplifier device is biased on;

a second adjustable phase delay circuit succeeding the second RF amplifier device and that receives the second amplified RF signal and routes the second amplified RF signal to the power combiner; and wherein a phase delay and a reactance of each of the first adjustable phase delay circuit and the second adjustable phase delay circuit is controllably adjusted based on a frequency of the RF input signal and wherein the second adjustable phase delay circuit is designed to prevent the flow of power from the power combiner back into the output of the second amplifier while the second amplifier is cutoff but to allow power flow from the second amplifier to the combine point when the second amplifier is biased on.

15. The radio frequency (RF) amplifier structure of claim 14, further comprising: one or more of:

a third adjustable phase delay circuit preceding the first RF amplifier and that receives the first RF signal and routes the first RF signal to the first RF amplifier, a fourth adjustable phase delay circuit preceding the second RF amplifier and that receives the second RF signal and routes the second RF signal to the second RF amplifier.

16. The radio frequency amplifier structures of claim 15, wherein each adjustable phase delay circuit of the first and second adjustable phase delay circuits comprises a plurality of switched reactance elements.

17. The radio frequency amplifier structure of claim 16, wherein each switched reactance element of the plurality of switched reactance elements comprises a shunt switched variable length transmission line.

18. The radio frequency amplifier structure of claim 17, wherein each shunt switched variable length transmission line comprises a transmission line coupled to one or more shunt switching devices that are distributed at various distances along a length of the transmission line.

19. The radio frequency amplifier structure of claim 17, wherein the adjustable phase delay circuit further comprises a hybrid coupler having a coupled port and an isolated port, and wherein each port of the coupled port and the isolated port is coupled to a shunt switched variable length transmission line.

20. The radio frequency amplifier structure of claim 16, wherein the plurality of switched reactance elements comprises:

a first plurality of serially-connected transmission lines;

a second plurality of serially-connected transmission lines in parallel with the first plurality of serially-connected transmission lines;

a first set of switching devices, wherein each switching device of the first set of switching devices serially connects a transmission line of the first plurality of serially-connected transmission lines to a next transmission line of the first plurality of serially-connected transmission lines;

a second set of switching devices, wherein each switching device of the second set of switching devices serially connects a transmission line of the second plurality of serially-connected transmission lines to a next transmission line of the second plurality of serially-connected transmission lines; and a third set of switching devices, wherein each switching device of the third set of switching devices connects a transmission line of the first plurality of serially-connected transmission lines to a transmission line of the second plurality of serially-connected transmission lines.

21. The radio frequency (RF) amplifier structures of claim 14, wherein the RF amplifier structure comprises a Doherty amplifier, wherein the first RF amplifier stage is a carrier amplifier stage, and wherein the second RF amplifier stage is a peaking amplifier stage.

22. The radio frequency (RF) amplifier structures of claim 14, further comprising one or more of:

a phase matching transmission line interposed between the signal splitter and the second RF amplifier stage;

a phase offset circuit interposed between the signal splitter and the first RF amplifier stage, the signal splitter and the second amplifier stage, or the adjustable phase delay circuit and the power combiner;

an impedance inverter interposed between the first RF amplifier stage output impedance transform circuit and the power combiner.

23. The radio frequency (RF) amplifier structure of claim 22, wherein the impedance inverter comprises a hybrid coupler that is band-centered at a frequency that is above a highest frequency of operation of the RF amplifier structure so that the impedance inverter's insertion phase when configured as a phase shifter can be made approximately an odd multiple of 90 electrical degrees over a chosen frequency band of operation when external transmission lines and switching elements are connected to phasing ports of the impedance inverter.

24. The radio frequency (RF) amplifier structure of claim 22, wherein a phase delay of one or more of the phase matching transmission line, the phase offset circuit, and the impedance inverter is controllably adjusted based on the frequency of the RF input signal.

25. The radio frequency (RF) amplifier structure of claim 22, wherein the impedance inverter comprises a hybrid coupler that is band-centered at a frequency that is above a highest frequency of operation of the RF amplifier structure so that its insertion phase when configured as a phase shifter can be made substantially an odd multiple of 90 electrical degrees over a chosen frequency band of operation when external transmission lines and switching elements are connected to it phasing ports.

26. The radio frequency (RF) amplifier structure of claim 14, wherein the wideband impedance transformer comprises one or more of:
   a printed line asymmetrical gap coupled microstrip transformer;
   a hybrid coupler based frequency variable phase shifter based design having an effective characteristic impedance substantially equivalent to the geometric mean between the combine point impedance and the system impedance that the amplifier output is connected to; and
   an un-balanced to un-balanced balun type transformer.

27. A wireless communication device capable of amplifying a radio frequency (RF) signal, the wireless communication device comprising a processor coupled to the radio frequency (RF) amplifier structure of claim 14, wherein the processor is configured to controllably adjust a phase delay and a reactance of the first and second adjustable phase delay circuit by one or more of:
   activating one or more switching devices of the first adjustable phase delay circuit and the second adjustable phase delay circuit based on a frequency of the RF input signal; and
   deactivating one or more switching devices of the first adjustable phase delay circuit and the second adjustable phase delay circuit based on a frequency of the RF input signal.

28. A method for amplifying a radio frequency (RF) signal comprising:
   receiving an RF input signal;
   generating a plurality of RF signals based on the RF input signal;
   based on a frequency of the RF input signal, adjusting a phase delay and a reactance of one or more controllable, adjustable phase delay circuits to produce one or more phase-delay-and-reactance-adjusted phase delay circuits;
   amplifying, by a first amplifier stage, a first RF signal of the plurality of RF signals to produce a first amplified RF signal;
   amplifying, by a second amplifier stage, a second RF signal of the plurality of RF signals to produce a second amplified RF signal;
   adjusting, by use of the one or more phase-delay-and-reactance-adjusted phase delay circuits, a phase of one or more of:
      prior to the amplification by the first amplifier stage, the first RF signal;
      prior to the amplification by the second amplifier stage, the second RF signal;
      the first amplified RF signal;
      the second amplified RF signal;
   combining the first amplified RF signal and the second amplified RF signal, wherein the phase of one or more of the first RF signal, the second RF signal, the first amplified RF signal, and the second amplified RF signal has been adjusted by the one or more phase-delay-and-reactance-adjusted phase delay circuits.

29. The method of claim 28, wherein each adjustable phase delay circuit of the one or more adjustable phase delay circuits comprises a plurality of switched reactance elements, wherein each switched reactance element of the plurality of switched reactance elements comprises a shunt switched variable length transmission line having a transmission line coupled to one or more shunt switching devices that are distributed at various distances along a length of the transmission line, and wherein adjusting a phase delay and a reactance of one or more controllable, adjustable phase delay circuits comprises one or more of activating one or more of the one or more shunt switching devices and deactivating one or more of the one or more shunt switching devices.

30. The method of claim 28, wherein each adjustable phase delay circuit of the one or more adjustable phase delay circuits comprises a plurality of switched reactance elements, wherein the plurality of switched reactance elements comprises a first plurality of serially-connected transmission lines, a second plurality of serially-connected transmission lines in parallel with the first plurality of serially-connected transmission lines, a first set of switching devices, wherein each switching device of the first set of switching devices serially connects a transmission line of the first plurality of serially-connected transmission lines to a next transmission line of the first plurality of serially-connected transmission lines, a second set of switching devices, wherein each switching device of the second set of switching devices serially connects a transmission line of the second plurality of serially-connected transmission lines to a next transmission line of the second plurality of serially-connected transmission lines, and wherein adjusting a phase delay and a reactance of one or more controllable, adjustable phase delay circuits comprises activating a switching device of the first set of switching devices and activating a switching device of the second set of switching devices.

31. The method of claim 28, wherein the method is performed by a radio frequency (RF) amplifier structure, wherein the RF amplifier structure further comprises one or more of a phase matching transmission line, a phase offset circuit, and an impedance inverter, and wherein the method further comprises performing one or more of:
   adjusting a phase of the first RF signal by adjusting a phase delay of the phase matching transmission line based on a frequency of the RF input signal;
   adjusting a phase of the second RF signal by adjusting a phase delay of the phase offset circuit based on a frequency of the RF input signal; and
   adjusting a phase of the first amplified RF signal by adjusting a phase delay of the impedance inverter based on a frequency of the RF input signal.

* * * * *